US008159429B2

(12) United States Patent
Kim et al.

(10) Patent No.: US 8,159,429 B2
(45) Date of Patent: Apr. 17, 2012

(54) LIQUID CRYSTAL DISPLAY AND METHOD THEREOF

(75) Inventors: Dong-gyu Kim, Yongin-si (KR); Seong-young Lee, Anyang-si (KR); Sung-jae Moon, Seoul (KR); Hye-seok Na, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1308 days.

(21) Appl. No.: 11/778,714

(22) Filed: Jul. 17, 2007

(65) Prior Publication Data
US 2008/0204613 A1    Aug. 28, 2008

(30) Foreign Application Priority Data

Jul. 21, 2006  (KR) .................. 10-2006-0068658
Sep. 6, 2006   (KR) .................. 10-2006-0085875
Nov. 27, 2006  (KR) .................. 10-2006-0117667

(51) Int. Cl.
*G02F 1/133* (2006.01)
(52) U.S. Cl. ................ 345/87; 345/90; 345/94; 349/38
(58) Field of Classification Search .............. 345/87, 345/90, 94, 504, 694; 349/38, 146
See application file for complete search history.

(56) References Cited

U.S. PATENT DOCUMENTS

| 6,922,183 | B2 * | 7/2005 | Ting et al. ............. 345/87 |
| 7,365,725 | B2 * | 4/2008 | Nakayoshi et al. ...... 345/94 |
| 2004/0233343 | A1 * | 11/2004 | Baek ................. 349/38 |
| 2005/0269945 | A1 * | 12/2005 | Su .................. 313/504 |
| 2005/0280621 | A1 * | 12/2005 | Tsutsui et al. ......... 345/90 |
| 2006/0203172 | A1 * | 9/2006 | Baek et al. ........... 349/146 |
| 2007/0070093 | A1 * | 3/2007 | Lin et al. ............ 345/694 |

FOREIGN PATENT DOCUMENTS

| CN | 1693945    | 11/2005 |
| CN | 101361109 A | 2/2009 |
| JP | 09197440   | 7/1997 |
| JP | 2005099733 | 4/2005 |
| KR | 1020060004316 | 1/2006 |

* cited by examiner

*Primary Examiner* — Amare Mengistu
*Assistant Examiner* — Joseph G Rodriguez
(74) *Attorney, Agent, or Firm* — Cantor Colburn LLP

(57) ABSTRACT

A liquid crystal display ("LCD") capable of improving display quality includes a first insulating substrate, gate wiring lines formed on the first insulating substrate and extending in a first direction, data wiring lines insulated from and crossing the gate wiring lines and extending in a second direction, and pixel electrodes, each of which includes first and second sub-pixel electrodes that are applied with different data voltages from the data wiring lines, in which at least a part of the second sub-pixel electrode overlaps the data wiring lines.

33 Claims, 20 Drawing Sheets

LIQUID CRYSTAL DISPLAY AND METHOD THEREOF

This application claims priority to Korean Patent Application Nos. 10-2006-0068658, 10-2006-0085875, and 10-2006-0117667, filed on Jul. 21, 2006, Sep. 6, 2006, and Nov. 27, 2006, respectively, and all the benefits accruing therefrom under 35 U.S.C. §119, and the contents of which in their entireties are herein incorporated by reference.

BACKGROUND OF THE INVENTION

1. Field of the Invention

The present invention relates to a liquid crystal display ("LCD") and method thereof, and more particularly, to an LCD having improved display quality, and a method of improving display quality of the LCD.

2. Description of the Related Art

Liquid crystal displays ("LCDs") are now widely used as one type of flat panel display. An LCD includes two display panels, on which field generating electrodes, such as pixel electrodes and common electrodes, are formed with a liquid crystal layer interposed between the panels. In the LCDs, a voltage is applied to the field generating electrodes so as to generate an electric field in the liquid crystal layer, and the alignment of liquid crystal molecules of the liquid crystal layer is determined by the electric field. Then, the polarization of incident light is controlled, thereby performing image display.

Among the LCDs, an LCD of a vertically aligned ("VA") mode has been considered because it has a large contrast ratio and a wide reference viewing angle, in which the main directors of liquid crystal molecules are perpendicular to the upper and lower display panels in a state where an electric field is not applied. However, the VA mode LCD has a problem in that side visibility is lower compared with front visibility. In order to solve this problem, there has been suggested a method that divides one pixel into a pair of sub-pixels, forms switching elements in the individual sub-pixels, and applies different voltages to the sub-pixels.

However, in such an LCD according to the related art, since the movement of liquid crystal located above data lines cannot be accurately controlled due to an electric field between the pixel electrodes, light leakage occurs, which results in deterioration in display characteristics of the LCD.

Further, in the LCD having the above-described structure, when coupling capacitances between the sub-pixel electrode, to which a relatively higher data voltage is applied, and a pair of data lines located on both sides of the sub-pixel are inconsistent with each other, display characteristics deteriorate.

BRIEF SUMMARY OF THE INVENTION

The present invention provides a liquid crystal display ("LCD") capable of improving display quality. The display quality may be improved by reducing the coupling capacitances between the sub-pixel and the data lines adjacent to the sub-pixel.

The present invention also provides a method of improving display quality of the LCD.

According to exemplary embodiments of the present invention, an LCD includes a first insulating substrate, gate wiring lines formed on the first insulating substrate and extending in a first direction, data wiring lines insulated from and crossing the gate wiring lines, and the data wiring lines extending in a second direction, and pixel electrodes, each of which includes first and second sub-pixel electrodes, to which different data voltages are applied from the data wiring lines, in which at least a part of each second sub-pixel electrode overlaps the data wiring lines.

According to other exemplary embodiments of the present invention, an LCD includes a gate wiring line and a data wiring line insulated from and crossing each other on an insulating substrate, a pair of first and second thin film transistors ("TFTs") connected to the gate wiring line and the data wiring line, a first sub-pixel electrode connected to the first TFT, a second sub-pixel electrode surrounding the first sub-pixel electrode, separated from the first sub-pixel electrode by a gap, and connected to the second TFT, a first storage line overlapping the first sub-pixel electrode and receiving a first storage voltage, and a second storage line overlapping the second sub-pixel electrode and receiving a second storage voltage different from the first storage voltage.

According to still other exemplary embodiments of the present invention, an LCD includes gate lines, pairs of data lines insulated from and crossing the gate lines, and pixel electrodes electrically connected to the gate lines and the pairs of data lines. Here, each of the pixel electrodes includes a first sub-pixel electrode and a second sub-pixel electrode having a smaller area than the first sub-pixel electrode, and the first sub-pixel electrode overlaps the pairs of data lines.

According to yet other exemplary embodiments of the present invention, a method of improving display quality of an LCD having a matrix of pixel regions, includes forming gate wiring lines on an insulating substrate, the gate wiring lines extending substantially in a first direction, forming data wiring lines insulated from the gate wiring lines, the data wiring lines extending substantially in a second direction, the second direction substantially perpendicular to the first direction, forming first and second sub-pixel electrodes within each pixel region such that the second sub-pixel electrodes overlap adjacent data wiring lines in each pixel region, the second sub-pixel electrodes at least partially surrounding the first sub-pixel electrodes and having a larger area than the first sub-pixel electrodes, and applying a data voltage to the first sub-pixel electrodes that is larger than a data voltage applied to the second sub-pixel electrodes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
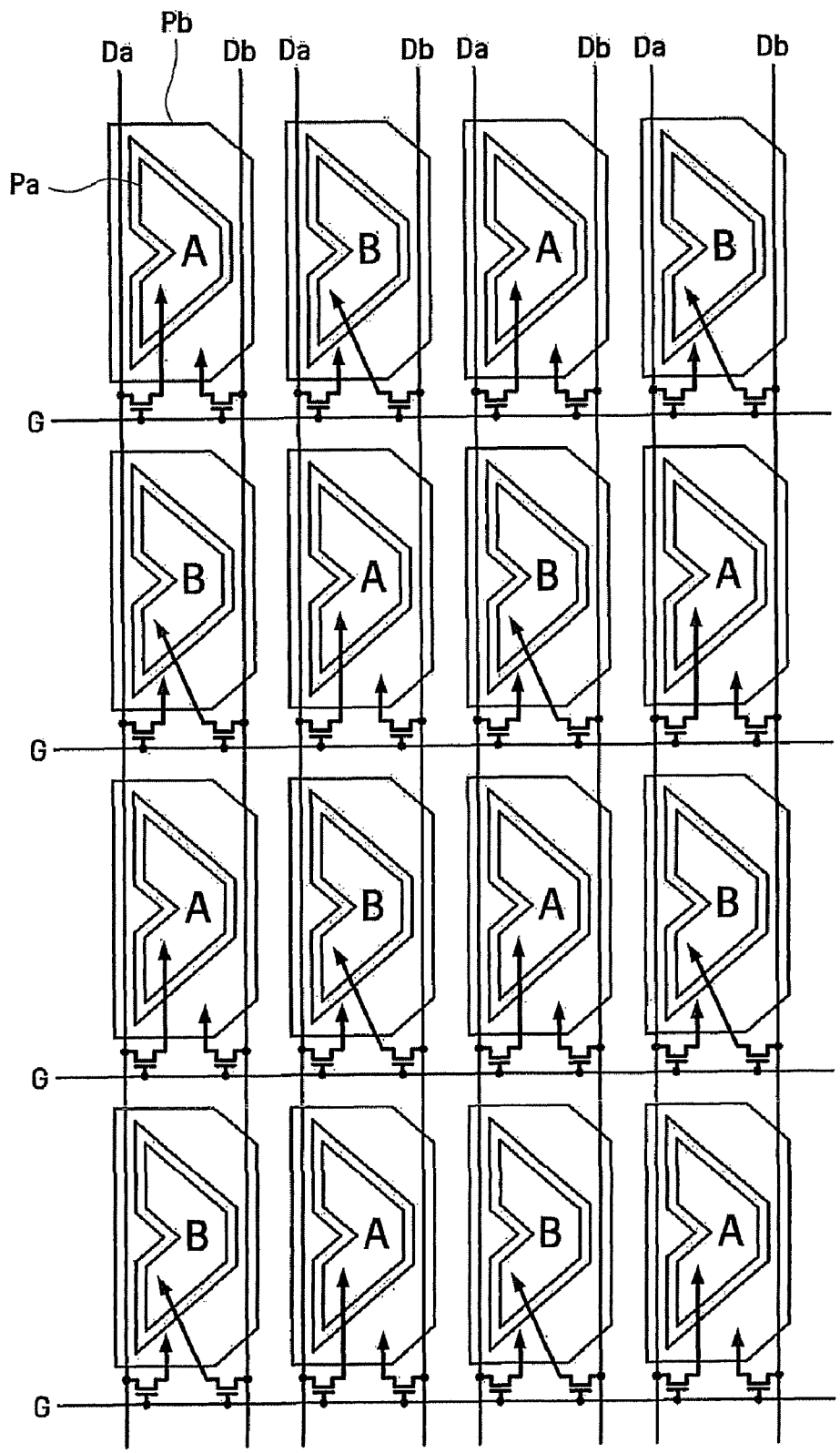
FIG. 1 is a schematic view illustrating an exemplary pixel array of an exemplary liquid crystal display ("LCD") according to a first exemplary embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. The size of each layer or each region may be exaggerated in the drawings for the purpose of a clear description.

It will be understood that when an element or a layer is referred to as being "on" another element or layer, it can be directly on the other element or intervening elements may also be present. In contrast, when an element is referred to as being "directly on" another element, there are no intervening elements present. Like reference numerals refer to like elements throughout the specification. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The terminologies, such as below, beneath, lower, above, upper, and the like, may be used to easily describe one element, components, other elements, or a positional relationship between components shown in drawings. It should be understood that the terminologies further mean other directions of elements during the usage and operation as well as the direction shown in the drawings.

Preferred embodiments of the invention will be described below with reference to plan views and cross-sectional views, which are exemplary drawings of the invention. The exemplary drawings may be modified by manufacturing techniques and/or tolerances. Accordingly, the preferred embodiments of the invention are not limited to specific configurations shown in the drawings, and include modifications based on manufacturing processes. Therefore, regions shown in the drawings have schematic characteristics. In addition, the shapes of the regions shown in the drawings exemplify specific shapes of regions in an element, and do not limit the invention.

Hereinafter, a liquid crystal display ("LCD") according to exemplary embodiments of the present invention will be described in detail with reference to the accompanying drawings.

Figure 2:
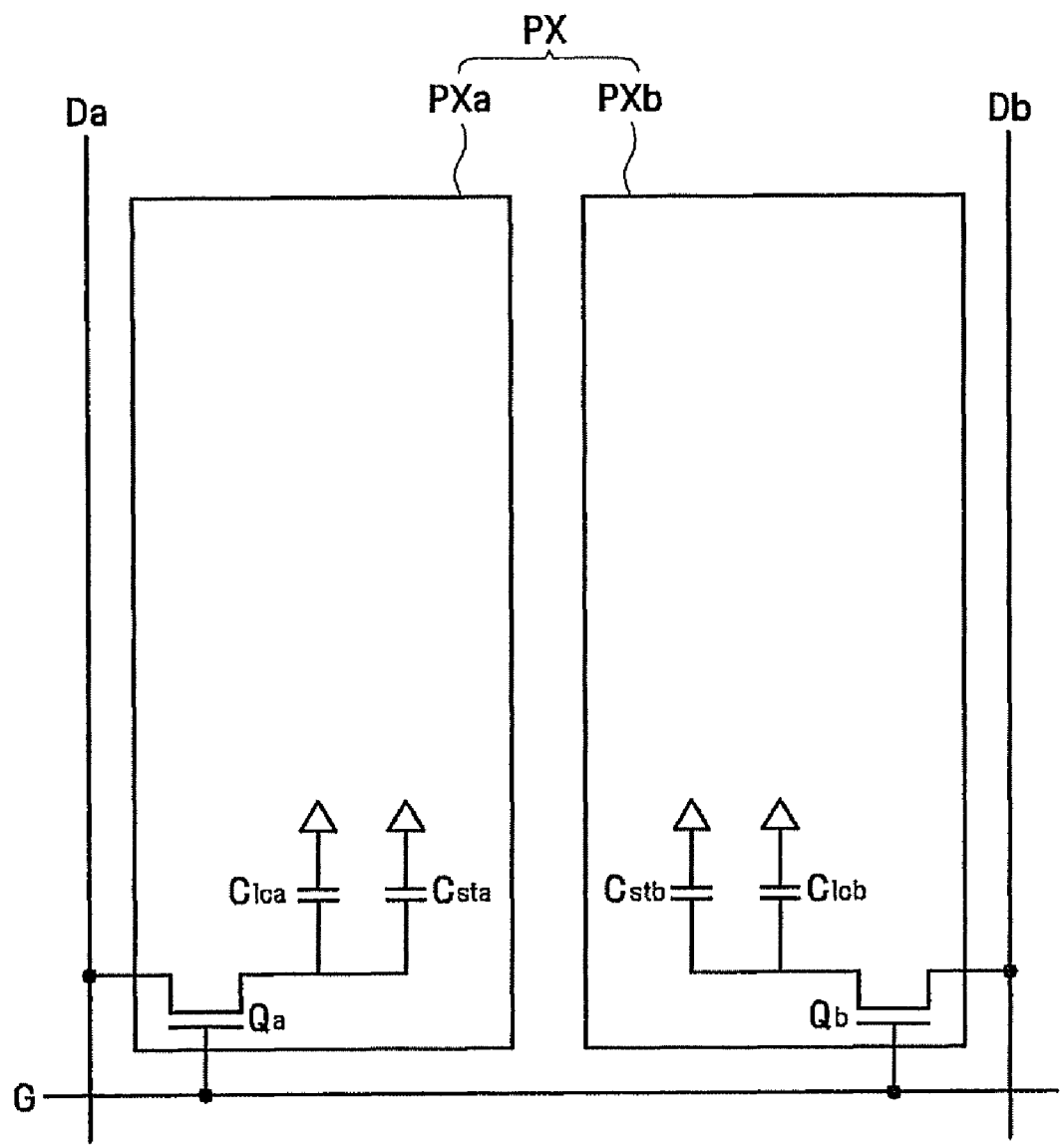
FIG. 2 is an equivalent circuit diagram of one exemplary pixel in the exemplary LCD of FIG. 1.

FIG. 1 is a schematic view illustrating an exemplary pixel array of the exemplary LCD according to the first exemplary embodiment of the present invention. FIG. 2 is an equivalent circuit diagram of one exemplary pixel in the exemplary LCD of FIG. 1.

The LCD of FIGS. 1 and 2 includes a liquid crystal panel assembly, a gate driver and a data driver that are connected to the liquid crystal panel assembly, a gray voltage generator that is connected to the data driver, and a signal controller that controls them.

The liquid crystal panel assembly includes a plurality of display signal lines, and a plurality of pixels PX that are connected to the display signal lines and substantially arranged in a matrix shape. Here, the liquid crystal panel assembly includes a lower display panel and an upper display panel that face each other, and a liquid crystal layer that is interposed between the lower and upper display panels.

Referring to FIGS. 1 and 2, the display signal lines are provided on the lower display panel, and include a plurality of gate lines G that transmit gate signals and data lines Da and Db that transmit data signals. The gate lines G substantially extend in a row direction, a first direction, in parallel with one another. The data lines Da and Db substantially extend in a column direction, a second direction, in parallel with one another, where the first direction is substantially perpendicular to the second direction.

Each of the pixels PX includes a pair of sub-pixels PXa and PXb. The sub-pixels PXa and PXb respectively include switching elements Qa and Qb that are connected to corresponding data lines Da and Db and one gate line G, liquid crystal capacitors Clca and Clcb that are connected to the switching elements Qa and Qb, respectively, and a pair of storage capacitors Csta and Cstb that are connected to the liquid crystal capacitors Clca and Clcb, respectively. That is, the two data lines Da and Db and the one gate line G are allocated to a pair of sub-pixels PXa and PXb. In alternative embodiments, the storage capacitors Csta and Cstb may not be included, if necessary.

The switching elements Qa and Qb of the respective sub-pixels PXa and PXb have thin film transistors ("TFTs") that are provided on the lower display panel. Each of the switching elements Qa and Qb is a three-terminal element that includes a control terminal (hereinafter, referred to as "gate electrode"), which is connected to the gate line G applied with a gate signal, an input terminal (hereinafter, referred to as "source electrode"), which is connected to each of the respective data lines Da and Db, and an output terminal (hereinafter, referred to as a "drain electrode"), which is connected to each of the respective liquid crystal capacitors Clca and Clcb and each of the respective storage capacitors Csta and Cstb.

Each of the liquid crystal capacitors Clca and Clcb has two terminals, which include the sub-pixel electrode Pa, Pb of the lower display panel and a common electrode of the upper display panel, and the liquid crystal layer interposed between the sub-pixel electrode Pa, Pb and the common electrode functions as a dielectric. The sub-pixel electrodes Pa and Pb are connected to the switching elements Qa and Qb, respectively. The common electrode is formed on the entire surface, or substantially the entire surface, of the upper display panel and is applied with a common voltage Vcom. Alternatively, the common electrode may be provided on the lower display panel. In this case, at least one of the pixel electrode and the common electrode may be formed in a linear or a bar shape.

Storage wiring lines provided on the lower display panel and the sub-pixel electrodes may overlap each other with an insulating material interposed there between, thereby forming the storage capacitors Csta and Cstb that assist the liquid crystal capacitors Clca and Clcb. A predetermined voltage, such as the common voltage Vcom, is applied to the storage wiring lines. Here, alternatively or additionally, the sub-pixel electrodes Pa, Pb and a previous gate line may overlap each other with an insulating material interposed there between, thereby forming the storage capacitors Csta and Cstb.

Meanwhile, in order to realize color display, each pixel PX uniquely displays one of a set of main colors (spatial division) or each pixel PX temporally and alternately displays the set of main colors (temporal division). Then, the primary colors are spatially and temporally synthesized, and thus a desired color is recognized. Examples of the main colors include three colors of red, green, and blue. As an example for the spatial division, each pixel PX may have a color filter that represents one of the colors in a region of the upper display panel.

Further, the color filter may be formed above or below the sub-pixel electrode Pa, Pb of the lower display panel.

Figure 15:
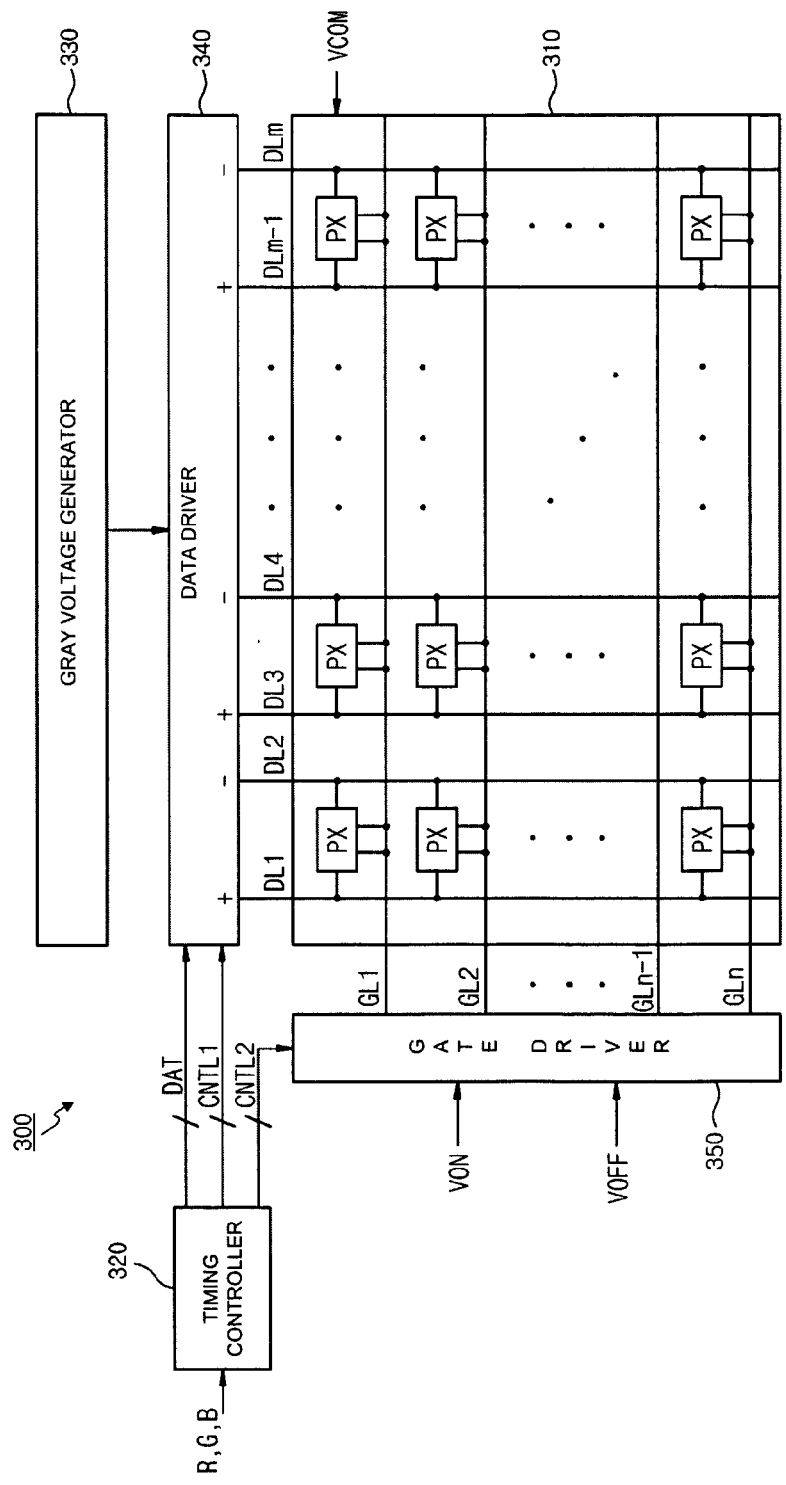
FIG. 15 is a block diagram illustrating an exemplary LCD, to which an exemplary lower display panel shown in FIG. 13 is applied.

The gate driver, as will be further described below with respect to FIG. 15, is connected to the gate lines G, and applies, to the gate lines G, the gate signals that are obtained by combining a gate on voltage Von and a gate off voltage Voff from the outside.

The gray voltage generator may generate two sets of gray voltages (or a set of reference gray voltages) related to transmittance of the pixels and provide the generated sets of gray voltages to the data driver. That is, the two sets of gray voltages may be independently provided to a pair of sub-pixels PXa, PXb forming a pixel PX. However, the present invention is not limited thereto. For example, instead of the two sets of gray voltages, one set of gray voltages may be generated.

The data driver is connected to pairs of data lines Da and Db. The data driver transmits a data voltage to one of the pair of sub-pixels, which form a pixel, through the data line Da, and a different data voltage to the other sub-pixel of the pair of sub-pixels, which form a pixel, through the data line Db.

The gate driver or the data driver may be directly mounted on the liquid crystal panel assembly in forms of a plurality of driving integrated circuit ("IC") chips or may be attached to the liquid crystal panel assembly while being mounted on a flexible printed circuit film (not shown) by a tape carrier package ("TCP"). Alternatively, the gate driver or the data driver may be integrated into the liquid crystal panel assembly together with the display signal lines G, Da, and Db, the TFT switching elements Qa and Qb, and the like.

The signal controller controls the operation of the gate driver, the data driver, and the like.

Returning to FIG. 1, one pixel includes two switching elements Qa, Qb, and the sub-pixel electrodes Pa and Pb that are connected to the switching elements Qa, Qb, respectively. Here, it is assumed that a relatively higher data voltage is applied to the first sub-pixel electrode Pa, and a relatively lower data voltage is applied to the second sub-pixel electrode Pb. Hereinafter, the low and high data voltages mean low and high differences between the common voltage and the data voltage. Further, a pixel that has the first sub-pixel electrode Pa applied with a data voltage through the first data line Da is referred to as an A-type pixel. A pixel that has a first sub-pixel electrode Pa applied with a data voltage through the second data line Db is referred to as a B-type pixel.

As shown in FIG. 1, the A-type pixels and B-type pixels are alternately arranged in a horizontal direction and a vertical direction, that is, in the first and second directions, and thus a vertical stripe or a horizontal stripe to be observed in the LCD can be prevented.

If the data voltage is applied to the first sub-pixel electrodes Pa of all the pixels through first data lines Da, that is, if a pixel array includes only the A-type pixels, and if the LCD is driven in a column inversion mode, then a vertical stripe that moves in a horizontal direction with respect to an inspection pattern, which moves in the horizontal direction by one pixel per frame, may be observed.

Further, if the data voltage is applied to the first sub-pixel electrodes Pa of one pixel row through the first data lines Da, and the data voltage is applied to the first sub-pixel electrodes Pa in the next pixel row through second data lines Db, that is, when A-type pixel rows and B-type pixel rows are alternately arranged, then it is possible to prevent the above-described vertical stripe moving in the horizontal direction from occurring. However, coupling between each of the first sub-pixel electrodes Pa and the first and second data lines Da and Db located on both sides of each of the first sub-pixel electrodes Pa occurs. Since coupling capacitances between each of the first sub-pixel electrodes Pa and the first and second data lines Da and Db vary depending on the A-type pixel and the B-type pixel, a horizontal stripe may be observed.

Therefore, like the LCD according to the first exemplary embodiment of the present invention, as shown in FIG. 1, as the A-type pixels and the B-type pixels are alternately arranged in the horizontal direction and the vertical direction, it is possible to prevent the above-described vertical stripe or the horizontal stripe that moves in the horizontal direction. However, when the LCD having such a structure operates at a low gray scale level, liquid crystal substantially operates by the first sub-pixel electrodes Pa to which a relatively higher voltage is applied. Therefore, the difference in coupling capacitance between the first sub-pixel electrodes Pa and the first data lines Da and between the first sub-pixel electrodes Pa and the second data lines Db is reduced to thereby prevent deterioration in display quality due to crosstalk.

Further, like the first exemplary embodiment of the present invention, as the first and second data lines Da and Db are disposed such that the second sub-pixel electrode Pb overlaps the first and second data lines Da and Db, and the second sub-pixel electrode Pb surrounds the first sub-pixel electrode Pa, it is possible to prevent the vertical stripe or the horizontal stripe from occurring even when the A-type pixels and the B-type pixels are not alternately disposed in the horizontal direction and the vertical direction. That is, the deterioration in display quality can be prevented by reducing the difference in coupling capacitance between the first and second data lines Da and Db and the first sub-pixel electrodes Pa. This will be further described below.

Hereinafter, referring to FIGS. 3A to 5, the exemplary LCD according to the first exemplary embodiment will be further described. The LCD according to this exemplary embodiment includes the lower display panel on which the TFT array is formed, the upper display panel that faces the lower display panel, and the liquid crystal layer interposed there between.

Figure 3A:
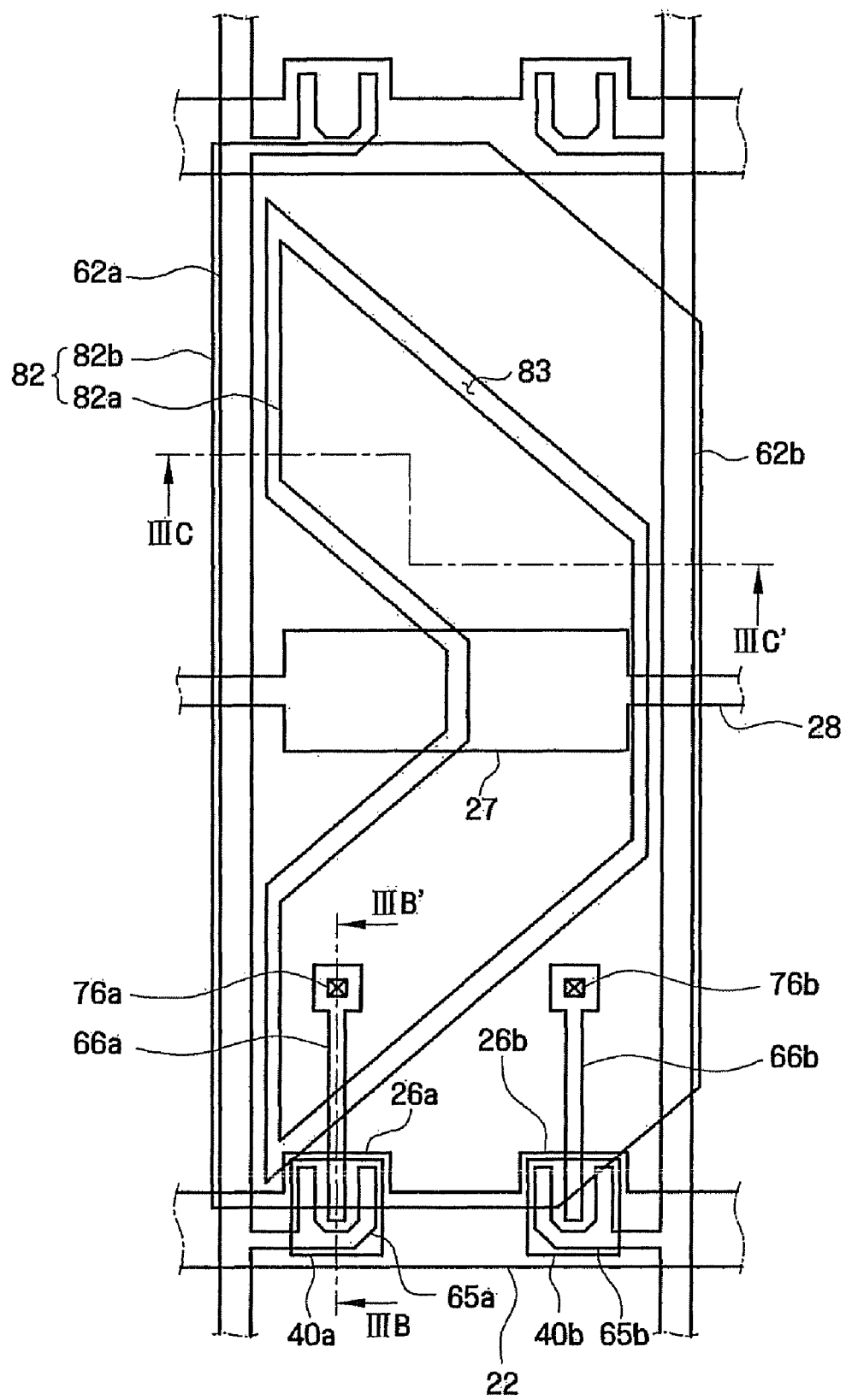
FIG. 3A is a layout view of an exemplary lower display panel that includes an exemplary A-type pixel of FIG. 1 according to the first exemplary embodiment of the present invention.
Figure 3B:
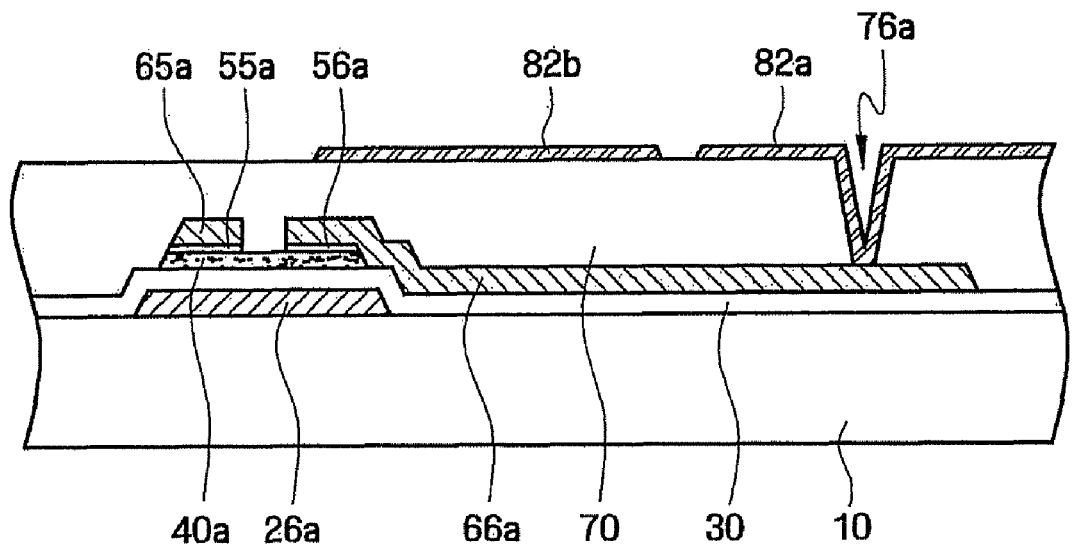
FIG. 3B is a cross-sectional view of the exemplary lower display panel taken along line IIIB-IIIB' of FIG. 3A.
Figure 3C:
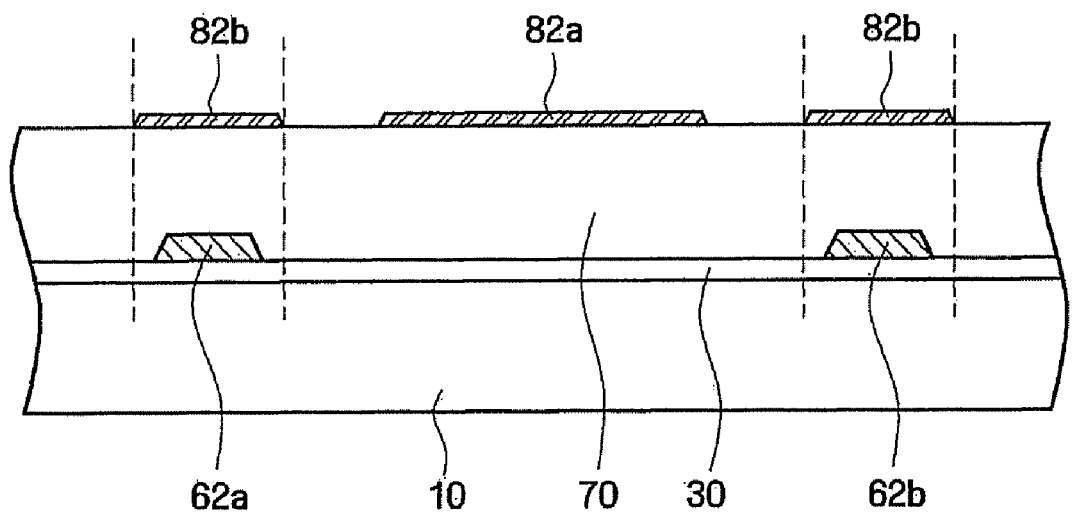
FIG. 3C is a cross-sectional view of the exemplary lower display panel taken along line IIIC-IIIC' of FIG. 3A.

First, referring to FIGS. 3A to 3C, the lower display panel of the LCD according to the first exemplary embodiment will be described. Here, FIG. 3A is a layout view of an exemplary lower display panel that includes an exemplary A-type pixel of FIG. 1 according to the first exemplary embodiment of the present invention. FIG. 3B is a cross-sectional view of the exemplary lower display panel taken along line IIIB-IIIB' of FIG. 3A. FIG. 3C is a cross-sectional view of the exemplary lower display panel taken along line IIIC-IIIC' of FIG. 3A.

Gate lines 22 that extend substantially in the horizontal or first direction and transmit gate signals are formed on an insulating substrate 10 that may be formed of transparent glass or the like. Each of the gate lines 22 is allocated to one row of pixels. Further, a pair of first and second protruding gate electrodes 26a and 26b are formed on the gate line 22 for each pixel. The gate line 22 and the first and second gate electrodes 26a and 26b are referred to as gate wiring lines.

Further, a storage line 28 is formed on the insulating substrate 10. The storage line 28 crosses a pixel region, and substantially extends in the horizontal direction, and is thus at least substantially parallel with the gate line 22. A storage electrode 27 is connected to the storage line 28 and has a width that is larger than a width of the storage line 28. The storage electrode 27 and the pixel electrode 82 overlap each other to thereby form a storage capacitor that improves charge capacity of the pixel. The storage electrode 27 and the storage line 28 are referred to as storage wiring lines. In this embodiment, the storage wiring lines 27 and 28 overlap a center of the pixel region, but the present invention is not limited thereto. In alternative embodiments, the shape and arrangement of the storage wiring lines 27 and 28 can be modified in various ways. Further, when sufficient storage capacitance is generated by overlapping the pixel electrode 82 and the gate line 22, the storage wiring lines 27 and 28 need not be included.

The gate wiring lines 22, 26a, and 26b and the storage wiring lines 27 and 28 may be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), titanium (Ti), or tantalum (Ta). In addition, each of the gate wiring lines 22, 26a, and 26b and each of the storage wiring lines 27 and 28 may have a multilayer structure that includes two conductive films (not shown) having different physical properties. In such a multilayer structure, one conductive film of the two conductive films may be formed of a metal having low resistivity, for example, an aluminum-based metal, a silver-based metal, or a copper-based metal, so as to reduce a signal delay or voltage drop in each of the gate wiring lines 22, 26a, and 26b and each of the storage wiring lines 27 and 28. The other conductive film in a multilayer structure is formed of, in particular, a material having excellent contact characteristics with respect to indium tin oxide ("ITO"), indium zinc oxide ("IZO"), or other pixel electrode material, and the other conductive film may be for example, a molybdenum-based metal, chromium, titanium, or tantalum. Examples of such multilayer structures include a structure that has a lower chromium film and an upper aluminum film, and a structure that has a lower aluminum film and an upper molybdenum film. However, the present invention is not limited thereto, and each of the gate wiring lines 22, 26a, and 26b and each of the storage wiring lines 27 and 28 may be formed of various metallic materials or conductors other than the above materials.

A gate insulating layer 30 formed of a silicon nitride ($SiN_x$) or the like is formed on the gate lines 22 and the storage wiring lines 27 and 28, as well as on exposed surfaces of the insulating substrate 10.

Semiconductor layers 40a and 40b formed of hydrogenated amorphous silicon ("a-Si") or polysilicon are formed on the gate insulating layer 30. The semiconductor layers 40a and 40b may have various shapes, such as an island shape or a stripe shape. For example, as illustrated, the semiconductor layers 40a and 40b may be formed to have an island shape. The semiconductor layers 40a and 40b are formed to overlap the gate electrodes 26a and 26b.

Ohmic contact layers 55a and 56a are formed on the semiconductor layers 40a and 40b, and may be formed of silicide or n+ hydrogenated a-Si in which n-type impurities are doped at high concentration. A pair of ohmic contact layers 55a and 56a are located on each of the semiconductor layers 40a and 40b.

A pair of first and second data lines 62a and 62b, and a pair of first and second drain electrodes 66a and 66b, which correspond to the first and second data lines 62a and 62b, respectively, are formed on the ohmic contact layers 55a and 56a and the gate insulating layer 30.

The first and second data lines 62a and 62b extend substantially in a vertical direction, cross the gate lines 22 and the storage lines 28, and transmit data voltages. First and second source electrodes 65a and 65b that extend toward the first and second drain electrodes 66a and 66b, respectively, protrude from the first and second data lines 62a and 62b, respectively. As shown in FIG. 3A, one pixel is divided into a pair of sub-pixels, the first data line 62a transmits a data signal to one sub-pixel, and the second data line 62b transmits a different data signal to the other sub-pixel, as will be further described below.

The first and second data lines 62a and 62b, the first and second source electrodes 65a and 65b, and the first and second drain electrodes 66a and 66b are referred to as data wiring lines.

Each of the data wiring lines 62a, 62b, 65a, 65b, 66a, and 66b may be preferably formed of a refractory metal, such as chromium, a molybdenum-based metal, tantalum, or titanium. Further, each of the data wiring lines 62a, 62b, 65a, 65b, 66a, and 66b may have a multilayer structure in which an upper layer (not shown) formed of a low-resistance material is formed on a lower layer (not shown) formed of a refractory metal or the like. Examples of the multilayer structure may include a three-layer structure that has a lower molybdenum layer, an intermediate aluminum layer, and an upper molybdenum layer, as well as the above-mentioned dual-layer structures that have a lower chromium layer and an upper aluminum layer, or that have a lower aluminum layer and an upper molybdenum layer. However, the present invention is not limited thereto, and each of the data wiring lines 62a, 62b, 65a, 65b, 66a, and 66b may be formed of various metallic materials or conductors other than the above materials.

The semiconductor layers 40a and 40b are at least partially overlapped by the first and second source electrodes 65a and 65b, respectively. The first and second drain electrodes 66a and 66b face the first and second source electrodes 65a and 65b, respectively, with respect to the gate electrodes 26a and 26b. The semiconductor layers 40a and 40b are at least partially overlapped by the first and second drain electrodes 66a and 66b, respectively. Here, the above-described ohmic contact layers 55a and 56a may exist between the semiconductor layers 40a and 40b and the first and second source electrodes 65a and 65b and between the semiconductor layers 40a and 40b and the first and second drain electrodes 66a and 66b to reduce contact resistance there between.

A passivation layer 70 is formed on the data wiring lines 62a, 62b, 65a, 65b, 66a, and 66b and the exposed semiconductor layers 40a and 40b, as well as on exposed portions of the gate insulating layer 30. The passivation layer 70 is formed of an inorganic material, such as silicon nitride or silicon oxide, an organic material that has a good planarizing characteristic and photosensitivity, or an insulating material having a low dielectric constant, such as a-Si:C:O or a-Si:O:F, which is formed by plasma enhanced chemical vapor deposition ("PECVD"). In addition, the passivation layer 70 may have a dual-layer structure, which includes a lower inorganic layer and an upper organic layer, to improve characteristics of the organic film and protect the exposed semiconductor layers 40a and 40b. Further, a red, green or blue color filter layer may be used as the passivation layer 70.

A pixel electrode 82 formed on the passivation layer 70 includes first and second sub-pixel electrodes 82a and 82b that are separated from each other. Here, each of the first and second sub-pixel electrodes 82a and 82b may be formed of a transparent electric conductor, such as ITO or IZO, or a reflective electric conductor, such as aluminum.

The first and second sub-pixel electrodes 82a and 82b are electrically connected to the first and second drain electrodes 66a and 66b through first and second contact holes 76a and 76b, respectively, and are applied with different data voltages from the first and second drain electrodes 66a and 66b.

The first and second sub-pixel electrodes 82a and 82b, to which the data voltages are applied, generate an electric field together with the common electrode on the upper display panel, thereby determining the arrangement of liquid crystal molecules in the liquid crystal layer between the first and second sub-pixel electrodes 82a and 82b and the common electrode.

Further, as described above, referring to FIGS. 2 and 3A, the sub-pixel electrodes 82a and 82b, and the common electrode form the liquid crystal capacitors Clca and Clcb, respectively, thereby maintaining the applied voltages even after the TFTs Qa and Qb are turned off. In order to increase the voltage maintaining capacity, the storage capacitors Csta and Cstb connected in parallel with the liquid crystal capacitors Clca and Clcb may be formed in such a way that the first and second sub-pixel electrodes 82a and 82b or the first and second drain electrodes 66a and 66b connected to the first and second sub-pixel electrodes 82a and 82b overlap the storage wiring lines 27 and 28.

Returning to FIGS. 3A to 3C, one pixel electrode 82 includes the first and second sub-pixel electrodes 82a and 82b that are electrically separated from each other by a gap 83. The first sub-pixel electrode 82a has an approximately horizontal V-shape, such as a rotated and truncated V-shape. The second sub-pixel electrode 82b is formed in a region of the pixel that excludes the first sub-pixel electrode 82a and the gap 83. Specifically, the second sub-pixel electrode 82b is formed to surround the periphery of the first sub-pixel electrode 82a.

The gap 83 includes inclined portions that are inclined with respect to the gate line 22 by approximately 45° or −45°, and vertical parts portions that connect between the inclined parts portions and are arranged along the first and second data lines 62a and 62b.

Figure 4:
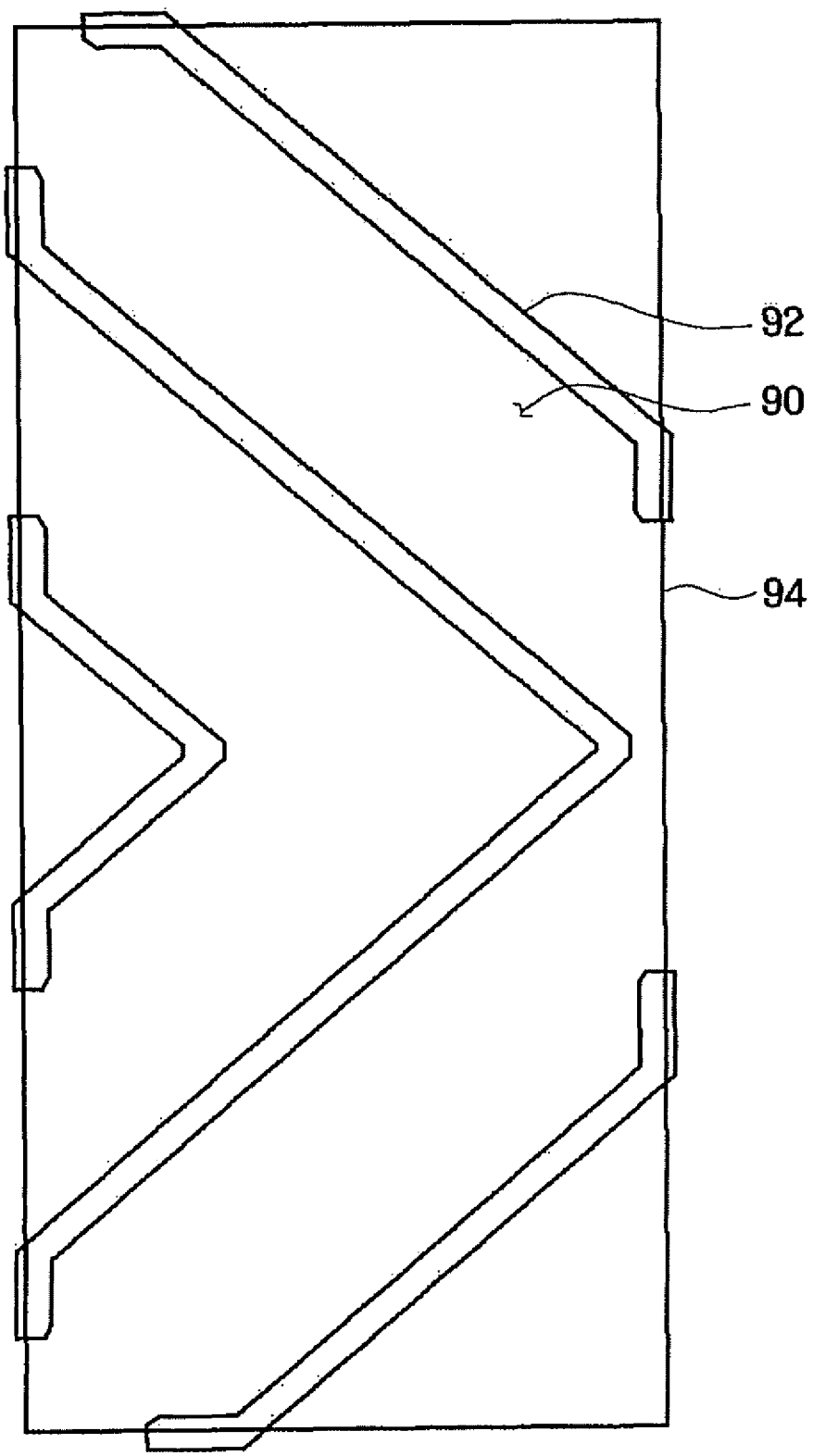
FIG. 4 is a layout view of an exemplary upper display panel that is coupled to the exemplary lower display panel of FIG. 3A.

Though not shown in the drawings, domain dividing means (not shown) that are inclined with respect to the gate line 22 by approximately 45° or −45°, for example, cutouts or protrusions, may be formed. A display region of the pixel electrode 82 is divided into a plurality of domains along directions in which the main directors of the liquid crystal molecules included in the liquid crystal layer are arrayed at the time of applying when an electric field is applied. The gap 83 and the domain dividing means serve to divide the pixel electrode 82 into many domains. Here, a domain refers to a region where liquid crystal molecules are formed while the liquid crystal molecules are collectively inclined or tilted in a predetermined direction by an electric field formed between the pixel electrode 82 and the common electrode 90, as shown in FIG. 4.

As described above, the entire first sub-pixel electrode 82a has a V-shape, and the second sub-pixel electrode 82b is formed to surround the first sub-pixel electrode 82a. Specifically, the second sub-pixel electrode 82b includes main regions and bridge regions. The main regions are adjacent to the inclined portions of the gap 83, which are inclined with respect to the gate line 22 by approximately 45° or −45°, and control the movements of the liquid crystal molecules. The bridge regions are adjacent to the vertical portions of the gap 83, are arranged along the first and second data lines 62a and 62b, and connect the main regions to each other.

As shown in FIGS. 3A and 3C, the first and second data lines 62a and 62b are formed such that the second sub-pixel electrode 82b at least partially overlaps the first and second data lines 62a and 62b. Preferably, the first and second data lines 62a and 62b are formed such that the second sub-pixel electrode 82b completely overlaps the first and second data lines 62a and 62b. Specifically, the bridge regions of the second sub-pixel electrode 82b overlap the first and second data lines 62a and 62b.

An alignment layer (not shown) may be coated on the first and second sub-pixel electrodes 82a and 82b and the passivation layer 70.

Figure 5:
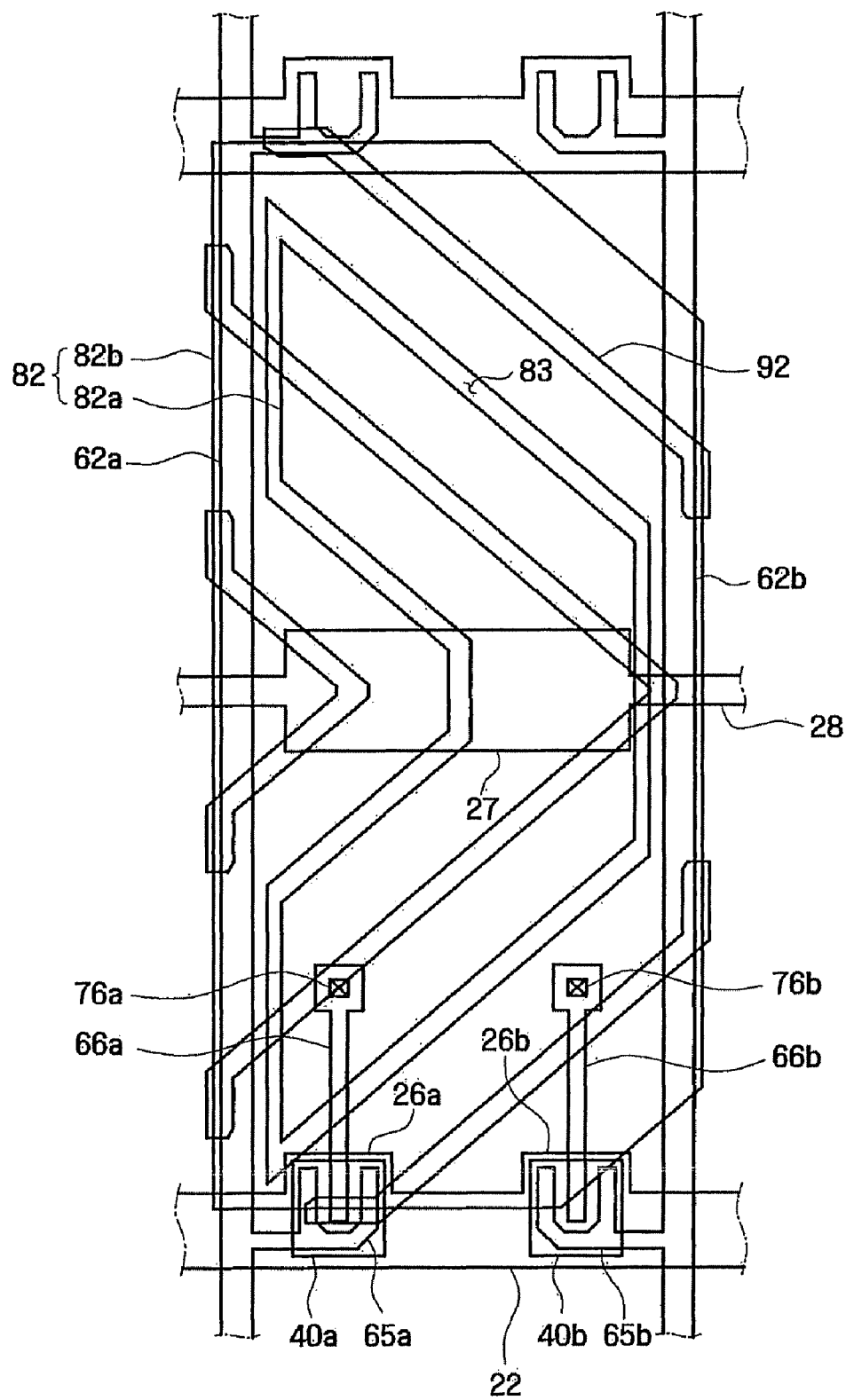
FIG. 5 is a layout view of an exemplary LCD that includes the exemplary lower display panel of FIG. 3A and the exemplary upper display panel of FIG. 4.

Next, referring to FIGS. 4 and 5, the exemplary upper display panel and the exemplary LCD will be described. Here, FIG. 4 is a layout view of an exemplary upper display panel that is coupled to the exemplary lower display panel of FIG. 3A. FIG. 5 is a layout view of an exemplary LCD that includes the exemplary lower display panel of FIG. 3A and the exemplary upper display panel of FIG. 4.

A black matrix 94 that prevents light leakage and defines pixel regions is formed on an insulating substrate (not shown) that is formed of transparent glass or the like. The black matrix 94 may be formed on portions corresponding to the gate line 22 and the first and second data lines 62a and 62b, and a portion corresponding to the TFT. Further, the black matrix 94 may have various shapes so as to block light leakage around the first and second sub-pixel electrodes 82a and 82b and the TFT. The black matrix 94 may be formed of a metal (metal oxide), such as chromium or chromium oxide, or an organic black resist.

Red, green, and blue color filters (not shown) may be sequentially arranged in the pixel regions in the black matrix 94.

An overcoat layer (not shown) may be formed on the color filters so as to remove a step between the color filters.

The common electrode 90 that is formed of a transparent conductive material, such as ITO or IZO, is formed on the overcoat layer. The common electrode 90 may include domain dividing means 92 that face the first and second sub-pixel electrodes 82a and 82b and are inclined with respect to the gate line 22 by approximately 45° or −45°, and may include cutouts or protrusions.

An alignment layer (not shown) that aligns the liquid crystal molecules may be formed on the common electrode 90.

The lower display panel and the upper display panel having the above-described structures are aligned and coupled to each other, and liquid crystal materials are injected therebetween and perpendicularly aligned. In this way, a basic structure of the LCD according to the first exemplary embodiment is formed.

In a state where an electric field is not applied to the pixel electrode 82 and the common electrode 90, the liquid crystal molecules included in the liquid crystal layer are aligned such that the directors thereof are perpendicular to the lower display panel and the upper display panel. Further, the liquid crystal molecules have negative dielectric anisotropy.

The LCD may further include components, such as polarizers and backlights, in addition to the above-mentioned basic structure. Here, the polarizers may be respectively provided on both sides of the basic structure so that one of the transmission axes of the polarizers is in parallel with the gate line 22 and the other transmission axis is orthogonal to the gate line 22.

When an electric field is applied between the lower display panel and the upper display panel, an electric field perpendicular to the upper and lower display panels is generated in almost all the regions. However, a horizontal electric field is generated around the gap 83 of the pixel electrode 82 and the domain dividing means 92 of the common electrode 90. The horizontal electric field helps align the liquid crystal molecules in each of the domains.

Since the liquid crystal molecules of this embodiment have the negative dielectric anisotropy, when an electric field is applied to the liquid crystal molecules, the liquid crystal molecules in each of the domains are tilted to be orthogonal to the gap 83 or the domain dividing means 92 that divide the domains. Therefore, the liquid crystal molecules are titled in different directions on both sides of the gap 83 or the domain dividing means 92, and the inclined portions of the gap 83 or the inclined portions of the domain dividing means 92 are symmetrical with respect to the center of each pixel. As a result, the liquid crystal molecules are tilted in four directions with respect to the gate line 22 by substantially 45° or −45°. Since optical characteristics are compensated with each other due to the liquid crystal molecules that are tilted in four directions, a viewing angle is increased.

Hereinafter, referring to FIGS. 3A to 5, the operation of the exemplary LCD according to the first exemplary embodiment of the present invention will be described.

In the A-type pixel, a relatively higher data voltage is applied to the first sub-pixel electrode 82a that is connected to the first data line 62a, and a relatively lower data voltage is applied to the second sub-pixel electrode 82b that is connected to the second data line 62b. Accordingly, it is possible to improve side visibility of the LCD.

In particular, when the LCD operates at a low gray scale level, liquid crystal substantially operates by the first sub-pixel electrodes 82a to which the relatively higher data voltage is applied, and a voltage is not applied to the second sub-pixel electrodes 82b. In this case, since the second sub-pixel electrode 82b is substantially applied with the same voltage as the common electrode 90 on the upper display panel, the liquid crystal molecules disposed above the second sub-pixel electrode 82b are aligned such that the directors thereof are perpendicular to the lower display panel. Therefore, light emitted from the backlight cannot pass through the second sub-pixel electrode 82b but is blocked.

When the LCD operates at a high gray scale level, since entire luminance of the LCD is high, light leakage does not matter. Therefore, it is more important to prevent light leakage when the LCD operates at the low gray scale level. In general, light leakage occurs around the first and second data lines 62a and 62b. However, as in the first exemplary embodiment of the present invention, when the second sub-pixel electrode 82b overlaps the first and second data lines 62a and 62b and the LCD operates at the low gray scale level, light passing through the second sub-pixel electrode 82b is blocked by the second sub-pixel electrode 82b, and light leakage around the first and second data lines 62a and 62b can be prevented. Further, light leakage is prevented by using the second sub-pixel electrodes 82b that surround the first sub-pixel electrodes 82a without increasing the area of the black matrix 94, thereby increasing an aperture ratio.

When coupling capacitances between the first sub-pixel electrode 82a, to which a relatively higher voltage is applied, and the first and second data lines 62a and 62b are inconsistent with each other, display characteristics of the LCD may deteriorate. Therefore, the first sub-pixel electrode 82a is disposed such that the first sub-pixel electrode 82a does not overlap the first and second data lines 62a and 62b so as to reduce the coupling capacitances between the first sub-pixel electrode 82a and the first and second data lines 62a and 62b. Therefore, it is possible to prevent the coupling capacitances from affecting the display characteristics of the LCD.

Figure 6:
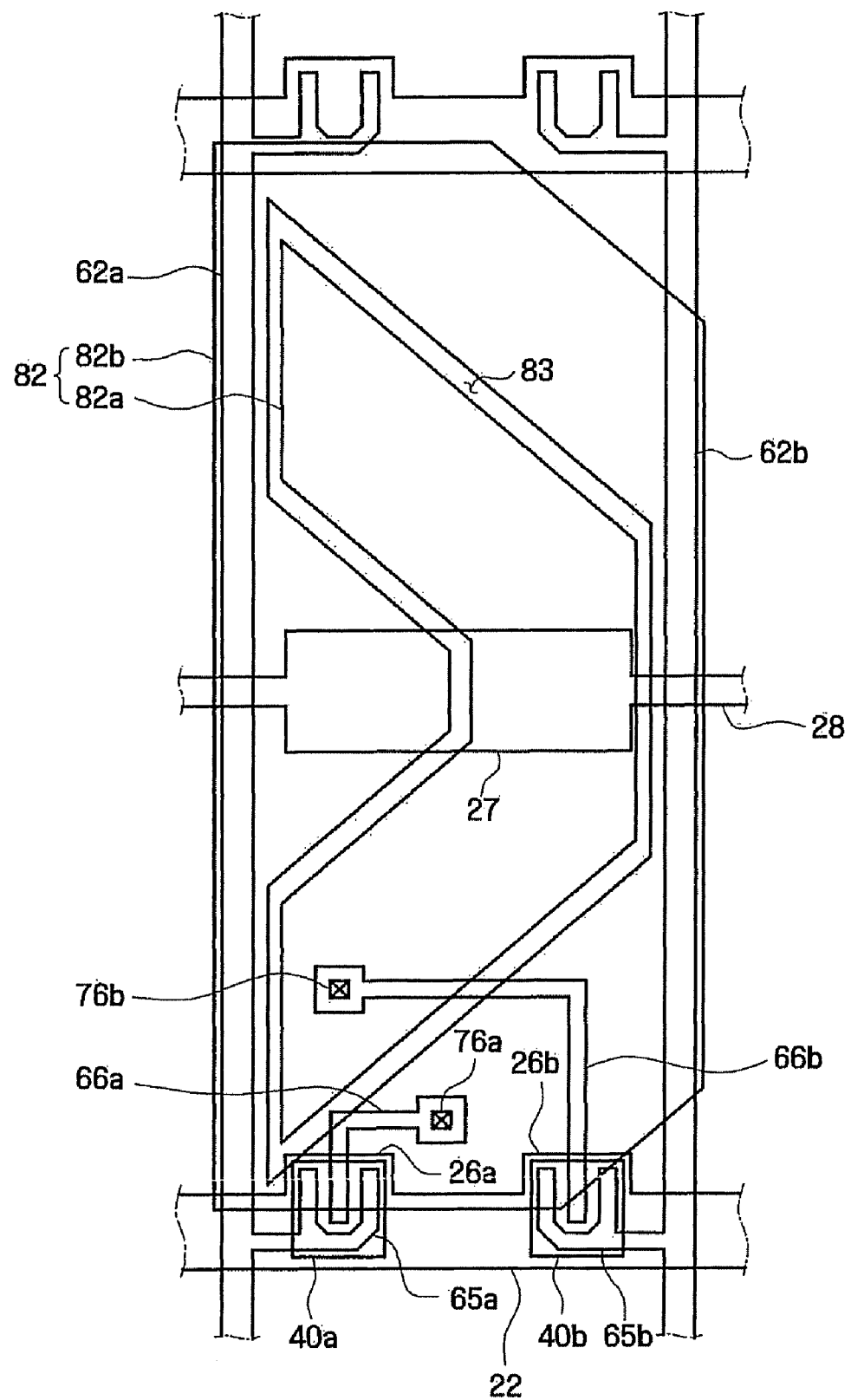
FIG. 6 is a layout view of an exemplary lower display panel that includes an exemplary B-type pixel of FIG. 1 according to the first exemplary embodiment of the present invention.

Hereinafter, another portion of the exemplary lower display panel of the exemplary LCD according to the first exemplary embodiment of the present invention will be described with reference to FIG. 6. FIG. 6 is a layout view of an exemplary lower display panel that includes an exemplary B-type pixel of FIG. 1 according to the first exemplary embodiment of the present invention. For convenience of explanation, parts having the same functions as those in FIGS. 3A to 5 are represented by the same reference numerals, and thus the descriptions thereof will be omitted. A description will be made concerning the differences.

As shown in FIG. 6, and unlike the A-type pixel, the B-type pixel includes the first drain electrode 66a connected to the second sub-pixel electrode 82b through the first contact hole 76a, and the second drain electrode 66b connected to the first sub-pixel electrode 82a through the second contact hole 76b. A relatively higher voltage is applied to the first sub-pixel electrode 82a that is connected to the second data line 62b, and a relatively lower voltage is applied to the second sub-pixel electrode 82b that is connected to the first data line 62a. Therefore, it is possible to improve side visibility of the LCD.

In a case of the LCD having the above-described structure, it is possible to prevent light leakage around the first and second data lines 62a and 62b and to increase an aperture ratio of the LCD. Further, the coupling capacitances between the first sub-pixel electrode 82a and the first and second data lines 62a and 62b are reduced to thereby prevent deterioration in display characteristics of the LCD.

Figure 7A:
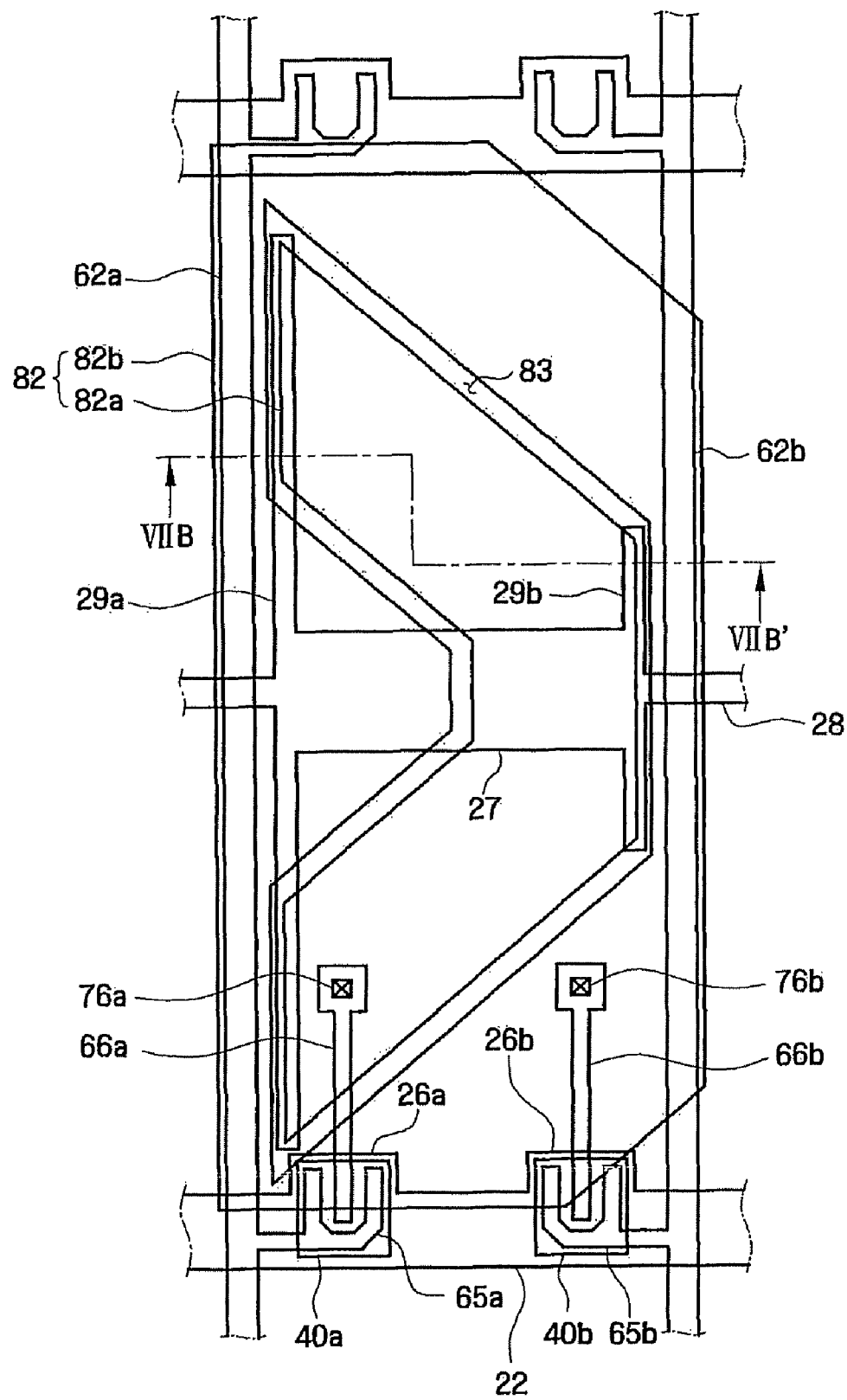
FIG. 7A is a layout view of an exemplary lower display panel that includes an exemplary A-type pixel of FIG. 1 according to a second exemplary embodiment of the present invention.
Figure 7B:
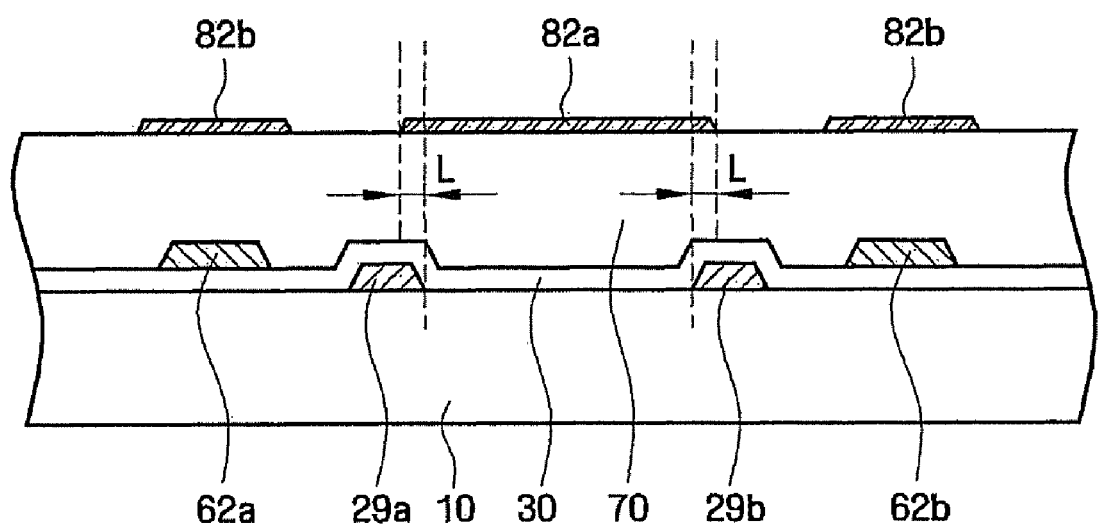
FIG. 7B is a cross-sectional view of the exemplary lower display panel taken along line VIIB-VIIB' of FIG. 7A.

Hereinafter, referring to FIGS. 7A and 7B, an exemplary lower display panel of an exemplary LCD according to a second exemplary embodiment of the present invention will be described in detail. FIG. 7A is a layout view of an exemplary lower display panel that includes an A-type pixel of FIG. 1 according to the second exemplary embodiment of the present invention. FIG. 7B is a cross-sectional diagram illustrating the exemplary lower display panel taken along line VIIB-VIIB' of FIG. 7A. For convenience of explanation, parts having the same functions as those in the above-described embodiment (FIGS. 1 to 6) are represented by the same reference numerals, and thus the descriptions thereof will be omitted. A description will be made concerning the differences.

As shown in FIGS. 7A and 7B, in order to further reduce coupling capacitances between a first sub-pixel electrode 82a, and first and second data lines 62a and 62b, first and second additional storage electrodes 29a and 29b that are connected to a storage line 28 and substantially extend in a vertical direction and in parallel with the first and second data lines 62a and 62b are formed.

Here, the first and second additional storage electrodes 29a and 29b may be formed such that a gap 83, which separates a first sub-pixel electrode 82a and a second sub-pixel electrode 82b from each other, partially overlaps the first and second additional storage electrodes 29a and 29b. Here, the gap 83 includes inclined portions that are inclined with respect to the gate line 22 by approximately 45° or −45°, and vertical portions that connect between the inclined portions and are arranged along the first and second data lines 62a and 62b. Therefore, it is preferable that the first and second additional storage electrodes 29a and 29b partially overlap the vertical portions of the gaps 83 that are adjacent to the first and second data lines 62a and 62b. The first and second additional storage electrodes 29a and 29b may protrude from edges of the storage electrode 27.

The first and second additional storage electrodes 29a and 29b and the first sub-pixel electrode 82a form a storage capacitor, such that it is possible to prevent the first sub-pixel electrode 82a from being coupled to the first and second data lines 62a and 62b.

Further, as shown in FIG. 7B, when the first sub-pixel electrode 82a partially overlaps the first and second additional storage electrodes 29a and 29b, coupling capacitances between the first sub-pixel electrode 82a, and the first and second data lines 62a and 62b can be further reduced. The first sub-pixel electrode 82a overlaps each of the first and second additional storage electrodes 29a and 29b by a width L, which may be, for example, about 1 to about 3 μm.

Figure 8:
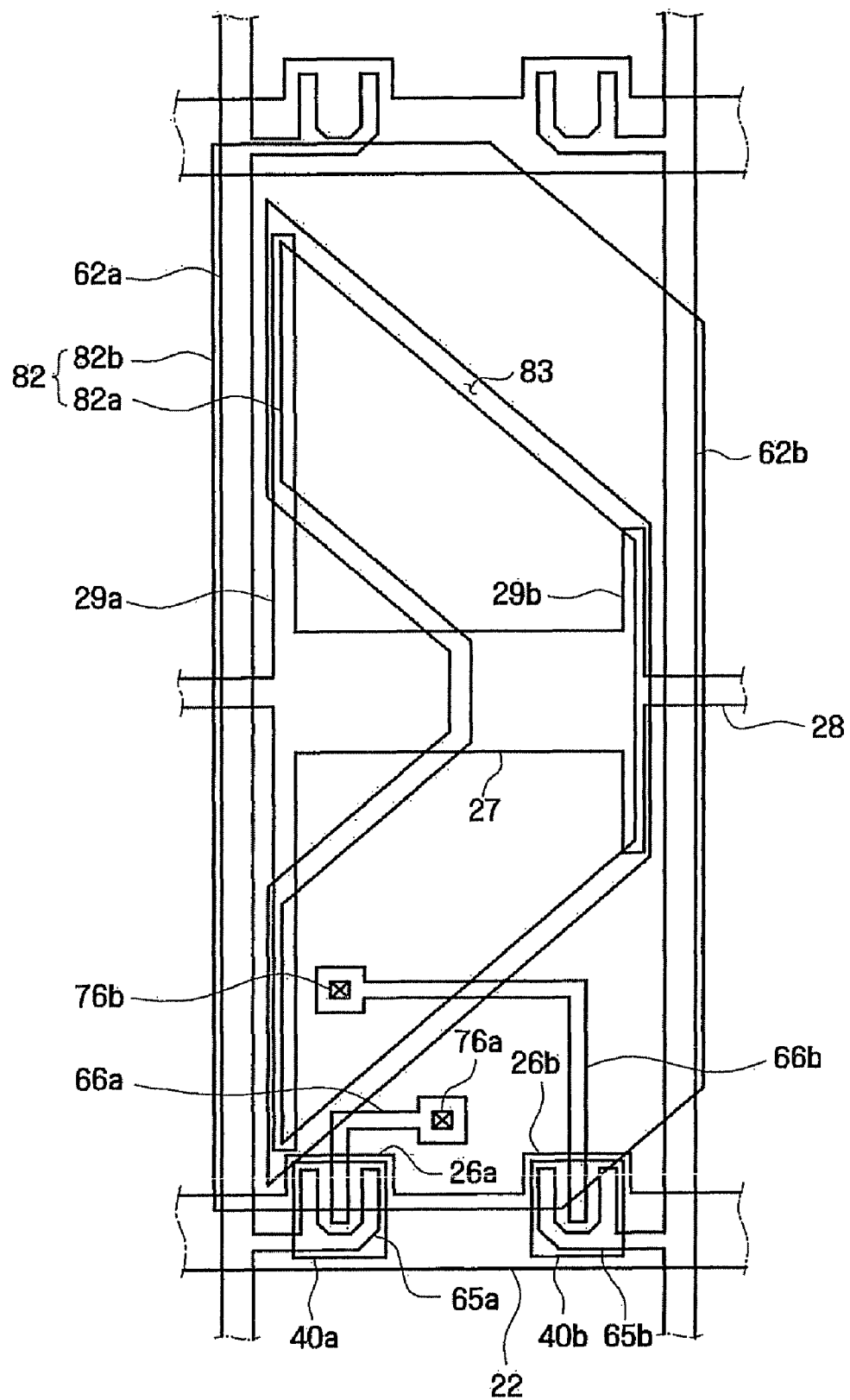
FIG. 8 is a layout view of an exemplary lower display panel that includes an exemplary B-type pixel of FIG. 1 according to the second exemplary embodiment of the present invention.

Hereinafter, another portion of the exemplary lower display panel of the exemplary LCD according to the second exemplary embodiment of the present invention will be described with reference to FIG. 8. FIG. 8 is a layout view of an exemplary lower display panel that includes an exemplary B-type pixel of FIG. 1 according to the second exemplary embodiment of the present invention. For convenience of explanation, parts having the same functions as those in FIGS. 7A and 7B are represented by the same reference numerals, and thus the descriptions thereof will be omitted. A description will be made concerning the differences.

As shown in FIG. 8, in the B-type pixel, the first drain electrode 66a is connected to the second sub-pixel electrode 82b through the first contact hole 76a, and the second drain electrode 66b is connected to the first sub-pixel electrode 82a through the second contact hole 76b. A relatively higher data voltage is applied to the first sub-pixel electrode 82a that is connected to the second data line 62b, and a relatively lower data voltage is applied to the second sub-pixel electrode 82b that is connected to the first data line 62a. Therefore, it is possible to improve side visibility of the LCD.

The B-type pixel shown in FIG. 8 includes the first and second additional storage electrodes 29a and 29b, as described above with respect to the A-type pixel shown in FIGS. 7A and 7B.

In a case of the LCD having the above-described structure, like the first exemplary embodiment, it is possible to prevent light leakage around the first and second data lines 62a and 62b and to increase an aperture ratio of the LCD. Further, coupling capacitances between the first sub-pixel electrode 82a, and the first and second data lines 62a and 62b are further efficiently reduced through the first and second additional storage electrodes 29a and 29b to thereby prevent deterioration of display characteristics of the LCD.

Hereinafter, in the LCD according to exemplary embodiments of the present invention, the coupling capacitances between the sub-pixel electrode and the data lines will be described with reference to FIGS. 1, 9A and 9B. It is preferable that a frequency of an input image signal is increased and a response speed of liquid crystal molecules is increased in order to prevent residual images and blurring of the image to be generated when motion pictures are played in the LCD. For example, in a case of an LCD that operates at a high frequency of 120 Hz or more, it is preferable that the LCD be driven in a column inversion mode, instead of a dot inversion mode, in consideration of the response speed of the liquid crystal molecules. Hereinafter, the coupling capacitances between the sub-pixel electrode and the data lines will be described in detail on the basis of the LCD that is driven by column inversion as an example. In the LCD that is driven in the column inversion mode, during a first frame, a positive polarity data voltage is applied to a first data line Da, and a negative polarity data voltage is applied to a second data line Db (here, the positive polarity and the negative polarity refer to polarities of the data voltage relative to the common voltage, such as will be described below with respect to FIG. 16). During a second frame, the negative polarity data voltage is applied to the first data line Da, and the positive polarity data voltage is applied to the second data line Db.

First, referring to FIGS. 1 and 9A, coupling capacitances between a first sub-pixel electrode Pa, to which a relatively higher data voltage is applied, and the data lines Da and Db will be described. FIG. 9A is a graph illustrating a luminance difference between an exemplary first sub-pixel electrode Pa of an exemplary A-type pixel and an exemplary first sub-pixel electrode Pa of an exemplary B-type pixel of FIG. 1 as a gray scale level changes. Here, since the first sub-pixel electrodes Pa of the A-type pixel and the B-type pixel have a larger area adjacent to the first data line Da than the second data line Db, coupling capacitance between the first sub-pixel electrode Pa and the first data line Da mainly affects a change in luminance of the LCD. Further, the first sub-pixel electrode Pa always has high luminance at a high gray scale level, but a change in luminance occurs at a low gray scale level.

In the case of the A-type pixel, during the first frame, the positive polarity data voltage is applied to the first sub-pixel electrode Pa through the first data line Da. During the second frame, the negative polarity data voltage is supplied to the first data line Da. Therefore, before the data voltage is applied to the first sub-pixel electrode Pa during the second frame, coupling occurs between the first sub-pixel electrode Pa and the first data line Da, and the data voltage that is stored in the first sub-pixel electrode Pa during the first frame is reduced. Therefore, luminance of the first sub-pixel electrode Pa is reduced.

In the case of the B-type pixel, during the first frame, the negative polarity data voltage is applied to the first sub-pixel electrode Pa through the second data line Db. During the second frame, the negative polarity data voltage is supplied to the first data line Da. Therefore, before the data voltage is applied to the first sub-pixel electrode Pa via the second data line Db during the second frame, coupling occurs between the first sub-pixel electrode Pa and the first data line Da, and thus the data voltage, which is stored in the first sub-pixel electrode Pa during the first frame, is further increased. Accordingly, luminance of the first sub-pixel electrode Pa is increased.

Figure 9A:
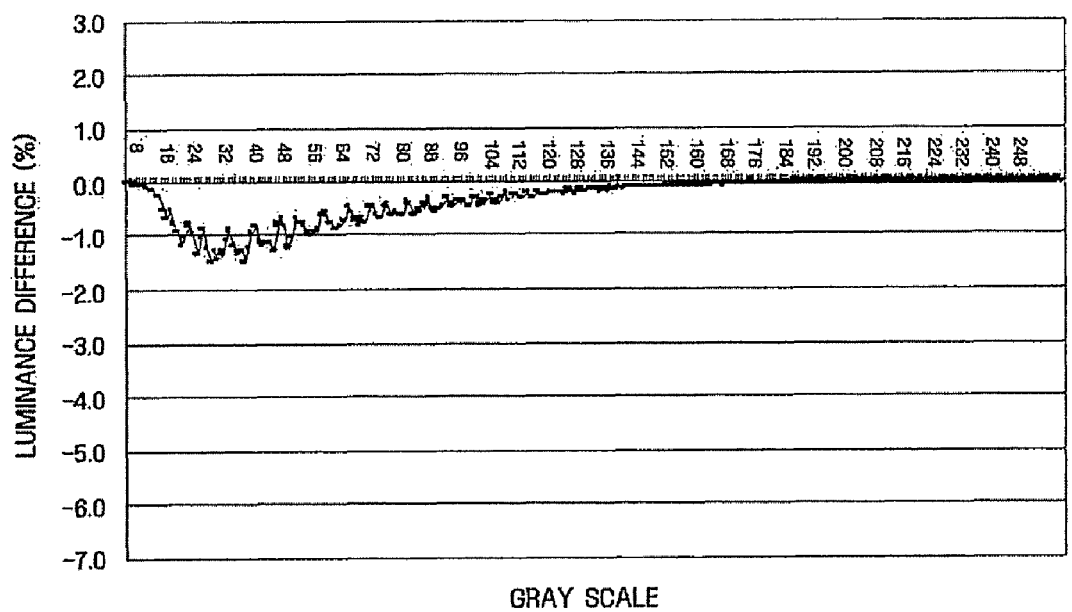
FIG. 9A is a graph illustrating a luminance difference between a first sub-pixel electrode Pa of an exemplary A-type pixel and a first sub-pixel electrode Pa of an exemplary B-type pixel of FIG. 1 as a gray scale level changes.

In FIG. 9A, luminance difference data shows a difference between a luminance root-mean-square ("RMS") value of the first sub-pixel electrode Pa of the A-type pixel with respect to the first and second frames and a luminance RMS value of the first sub-pixel electrode Pa of the B-type pixel with respect to the first and second frames. As shown in FIG. 9A, even though there is a luminance difference between the first sub-pixel electrodes Pa of the A-type pixels and the B-type pixels at a low gray scale level, the luminance difference is only approximately 1.5% or less. This means that the coupling capacitance between the first sub-pixel electrode Pa and the first and second data lines Pa and Pb is significantly reduced.

Figure 9B:
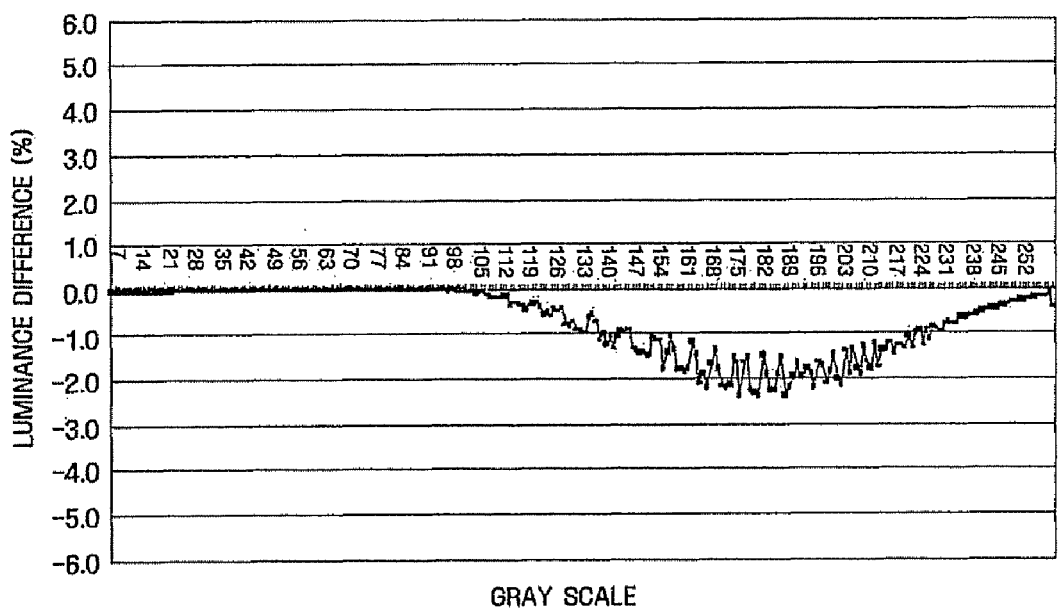
FIG. 9B is a graph illustrating a luminance difference between a second sub-pixel electrode Pb of an exemplary A-type pixel and a second sub-pixel electrode Pb of an exemplary B-type pixel of FIG. 1 as a gray scale changes.

Referring to FIGS. 1 and 9B, the coupling capacitances between the second sub-pixel electrode Pb, to which a relatively lower data voltage is applied, and the data lines Da and Db will be described. FIG. 9B is a graph illustrating a luminance difference between an exemplary second sub-pixel electrode Pb of an exemplary A-type pixel of FIG. 1 and an exemplary second sub-pixel electrode Pb of an exemplary B-type pixel of FIG. 1 as a gray scale level changes. Here, since the second sub-pixel electrodes Pb of the A-type and B-type pixels have a larger overlap area with respect to the first data line Da than the second data line Db, the coupling capacitance between the second sub-pixel electrodes Pb and the first data line Da mainly affects a change in luminance of the LCD. Further, since the second sub-pixel electrode Pb does not operate at a low gray scale level but operates at a high gray scale level, a change in luminance difference occurs at the high gray scale level.

In a case of the A-type pixel, during a first frame, a negative polarity data voltage is applied to the second sub-pixel electrode Pb through the second data line Db. During a second frame, the negative polarity data voltage is supplied to the first data line Da. Therefore, before the data voltage is applied to the second sub-pixel electrode Pb via the second data line Db during the second frame, coupling occurs between the second sub-pixel electrode Pb and the first data line Da, and the data voltage that is stored in the second sub-pixel electrode Pb during the first frame is increased. Therefore, luminance of the second sub-pixel electrode Pb is increased.

In a case of the B-type pixel, during the first frame, a positive polarity data voltage is applied to the second sub-pixel electrode Pb through the first data line Da. During the second frame, the negative polarity data voltage is supplied to the first data line Da. Therefore, before the data voltage is applied to the second sub-pixel electrode Pb via the first data line Da during the second frame, coupling occurs between the second sub-pixel electrode Pb and the first data line Da, and thus the data voltage, which is stored in the second sub-pixel electrode Pb during the first frame, is decreased. Accordingly, luminance of the second sub-pixel electrode Pb is decreased.

In FIG. 9B, luminance difference data shows a difference between a luminance RMS value of the second sub-pixel electrode Pb of the A-type pixel with respect to the first and second frames and a luminance RMS value of the second sub-pixel electrode Pb of the B-type pixel with respect to the first and second frames. As shown in FIG. 9B, even though there is a luminance difference between the second sub-pixel electrodes Pb of the A-type pixel and the B-type pixel at a high gray scale level, the luminance difference is only approximately 2.5% or less. This means that, even when the second sub-pixel electrode Pb overlaps the first and second data lines Da and Db, there are small coupling capacitances between the second sub-pixel electrode Pb and the first and second data lines Da and Db.

Hereinafter, referring to FIGS. 10 to 11C, an exemplary LCD according to a third exemplary embodiment of the present invention will be described. For convenience of explanation, parts having the same functions as those in above-described embodiments are represented by the same reference numerals, and thus the descriptions thereof will be omitted. A description will be made concerning the differences.

Figure 10:
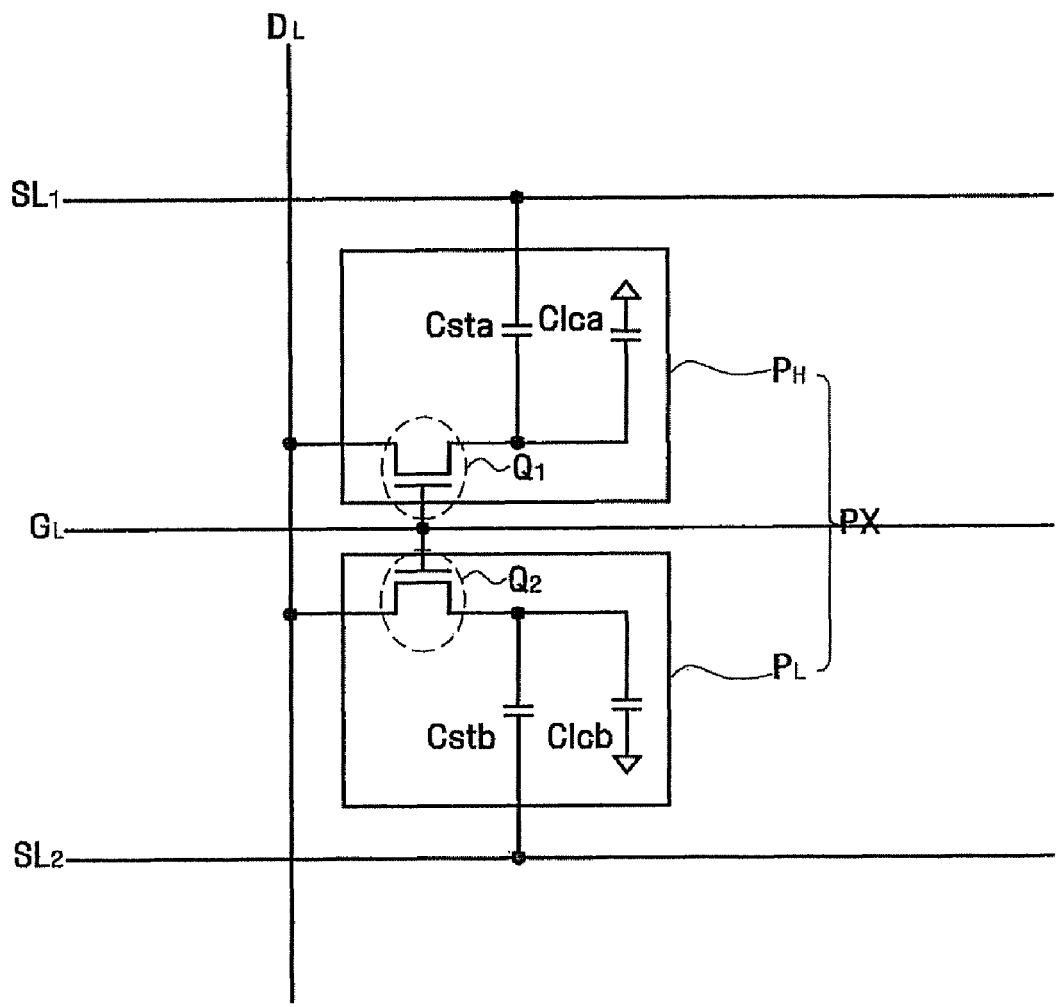
FIG. 10 is an equivalent circuit diagram of one exemplary pixel in an exemplary LCD according to a third exemplary embodiment of the present invention.

First, FIG. 10 shows an equivalent circuit diagram of exemplary display signal lines and an exemplary pixel. FIG. 10 is an equivalent circuit diagram of one exemplary pixel in the exemplary LCD according to the third exemplary embodiment of the present invention.

As shown in FIG. 10, display signal lines include a gate line $G_L$, a data line $D_L$, and first and second storage lines $SL_1$ and $SL_2$, which substantially extend in parallel with the gate line $G_L$ and the like.

Further, each of the pixels PX includes, for example, first and second sub-pixels $P_H$ and $P_L$. Here, the first and second sub-pixels $P_H$ and $P_L$ include switching elements Q1 and Q2, which are connected to the gate line $G_L$ and the data line $D_L$, respectively, liquid crystal capacitors Clca and Clcb, which are connected to the switching elements Q1 and Q2, respectively, and storage capacitors Csta and Cstb, which are connected to the switching elements Q1 and Q2, and storage lines $SL_1$ and $SL_2$, respectively.

Specifically, the first sub-pixel electrode $P_H$ includes the first switching element Q1, which is connected to the gate line $G_L$ and the data line $D_L$, the first liquid crystal capacitor Clca, which is connected to the first switching element Q1, and the first storage capacitor Csta, which is connected to the first switching element Q1 and the first storage line $SL_1$. Further, a second sub-pixel electrode $P_L$ includes the second switching element Q2, which is connected to the gate line $G_L$ and the data line $D_L$, the second liquid crystal capacitor Clcb, which is connected to the second switching element Q2, and the second storage capacitor Cstb, which is connected to the second switching element Q2 and the second storage line $SL_2$.

The first and second switching elements Q1 and Q2 of the respective first and second sub-pixels $P_H$ and $P_L$ are branched off from the same gate line $G_L$, and may include TFTs or the like. Here, each of the first and second switching elements Q1 and Q2 may be a three-terminal element that includes a gate electrode as a control terminal, which is connected to the gate line $G_L$, a source electrode as an input terminal, which is connected to the data line $D_L$, and a drain electrode as an output terminal, which is connected to each of the liquid crystal capacitors Clca and Clcb, and each of the first and second storage capacitors Csta and Cstb.

Each of the liquid crystal capacitors Clca and Clcb has two terminals of the first and second sub-pixel electrodes of the lower display panel and a common electrode of the upper display panel, and the liquid crystal layer interposed between the first and second sub-pixel electrodes and the common electrode functions as a dielectric. The first and second sub-pixel electrodes are connected to the switching elements Q1 and Q2, respectively. The common electrode is formed on the entire surface, or substantially the entire surface, of the upper display panel and is applied with a common voltage Vcom.

The first and second storage capacitor Csta and Cstb, which assist the first and second liquid crystal capacitor Clca and Clcb, respectively, have the first and second storage lines $SL_1$ and $SL_2$, and the first and second sub-pixel electrodes provided on the lower display panel overlapping each other with an insulating material interposed there between. First and second storage voltages may be applied to the first and second storage lines $SL_1$ and $SL_2$, respectively. The first and second storage voltages may have different values from each other, for example, common voltages Vcom that have opposite phases to each other.

Here, different data voltages may be formed in a first sub-pixel electrode of the first sub-pixel $P_H$ and a second sub-pixel electrode of the second sub-pixel $P_L$.

Specifically, the same data voltages are applied to the first sub-pixel electrode and the second sub-pixel electrode from the data line $D_L$ through the first and second switching elements Q1 and Q2. Here, since the first sub-pixel electrode is coupled to the first storage line $SL_1$, the data voltage applied to the first sub-pixel electrode is coupled to the first storage voltage applied to the first storage line $SL_1$, and thus the value of the data voltage changes. In the same manner, since the second sub-pixel electrode is coupled to the second storage line $SL_2$, the data voltage applied to the second sub-pixel electrode is coupled to the second storage line $SL_2$, and thus the value of the data voltage changes. As described above, when the first and second storage voltages have different voltages from each other, as a result, the data voltages formed in the first and second sub-pixel electrodes have different voltages from each other.

For example, the data voltage formed in the first sub-pixel electrode may have a higher value than the data voltage formed in the second sub-pixel electrode. In this case, the first sub-pixel $P_H$ may start to operate at a low gray scale level, and the second sub-pixel electrode $P_L$ may operate at an intermediate gray scale level or higher.

Figure 11A:
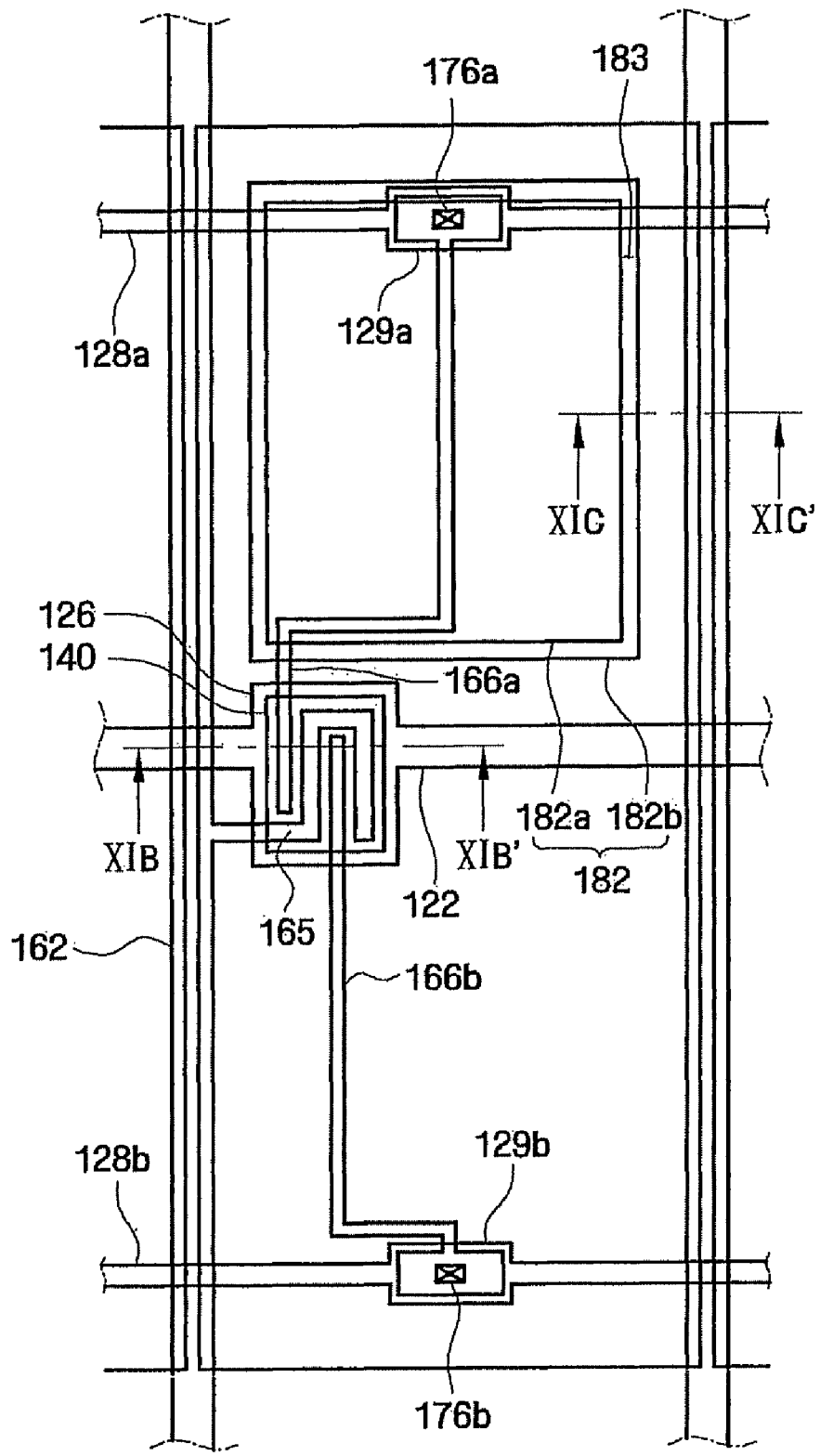
FIG. 11A is a layout view of an exemplary lower display panel of the exemplary LCD according to the third exemplary embodiment of the present invention.
Figure 11B:
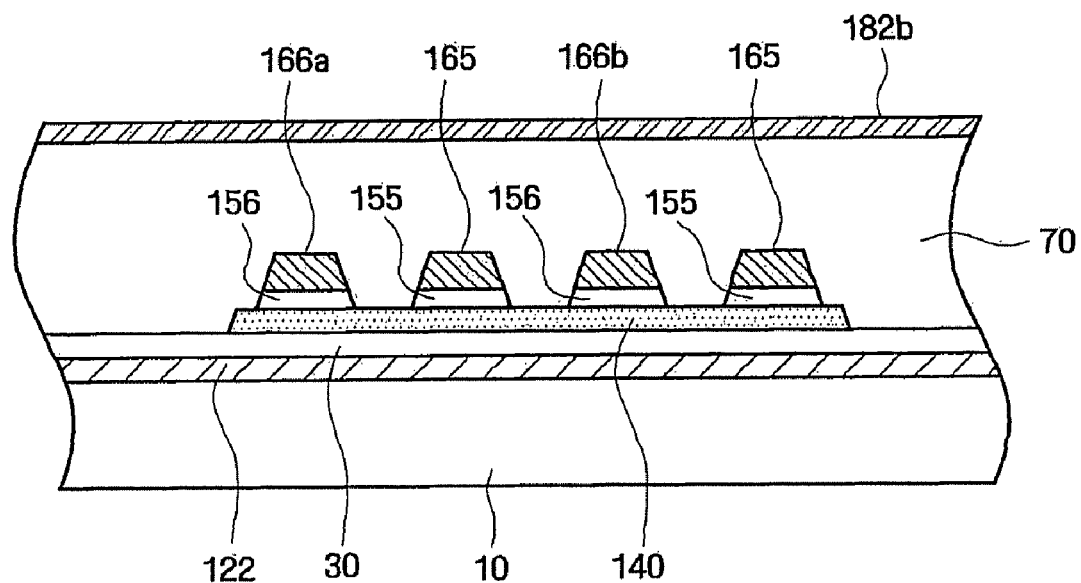
FIG. 11B is a cross-sectional view of the exemplary lower display panel taken along line XIB-XIB' of FIG. 11A.
Figure 11C:
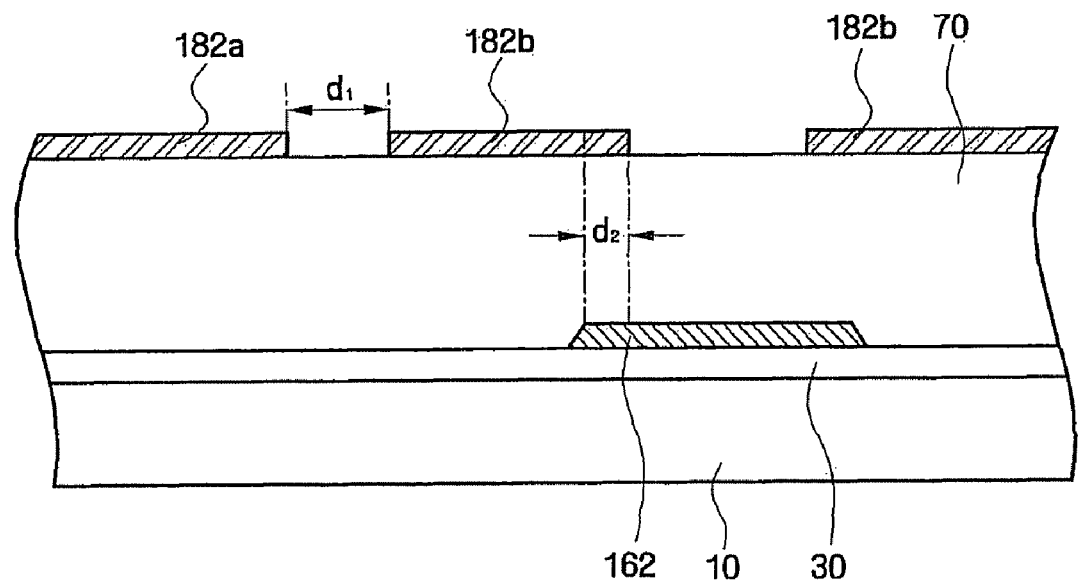
FIG. 11C is a cross-sectional view of the exemplary lower display panel taken along line XIC-XIC' of FIG. 11A.

Hereinafter, referring to FIGS. 11A to 11C, an exemplary lower display panel of the exemplary LCD according to the third exemplary embodiment of the present invention will be described in detail. Here, FIG. 11A is a layout view of the exemplary lower display panel of the exemplary LCD according to the third exemplary embodiment of the present invention. FIG. 11B is a layout view of the exemplary lower display panel taken along line XIB-XIB' of FIG. 11A. FIG. 11C is a cross-sectional view of the exemplary lower display panel taken along line XIC-XIC' of FIG. 11A.

Gate lines 122 and first and second storage lines 128a and 128b are formed on an insulating substrate 10 that is formed of, for example, transparent glass or the like.

A plurality of gate lines 122 extend in a first direction, for example, a horizontal direction, and are physically and electrically separated from each other. The gate lines 122 transmit gate signals. Further, a gate electrode 126 that is formed in a protrusion shape is formed on each of the gate lines 122 for each pixel in a row of pixels. The gate line 122 and the gate electrode 126 are referred to as gate wiring lines.

The first and second storage lines 128a and 128b substantially extend in the same direction as the gate lines 122, and have storage electrodes 129a and 129b, respectively, which have larger widths than the first and second storage lines 128a and 128b. Here, a pixel electrode 182, as will be further described below, overlaps the first and second storage electrodes 129a and 129b, such that a storage capacitor, which improves charge capacity of a pixel, is formed. The first and second storage lines 128a and 128b and the first and second storage electrodes 129a and 129b are referred to as storage wiring lines. In alternative embodiments, the shape and arrangement of the first and second storage lines 128a and 128b and the first and second storage electrodes 129a and 129b may be modified in various ways. First and second storage voltages, which are supplied from the outside, for example, common voltages Vcom having opposite phases to each other, may be applied to the first storage line 128a and the second storage line 128b.

The gate wiring lines 122 and 126 and the storage wiring lines 128a, 128b, 129a, and 129b may be formed of substantially the same materials as the gate wiring lines 22, 26a, and 26b as previously described with respect to FIG. 3A.

A gate insulating layer 30 formed of silicon nitride ($SiN_x$) or the like is formed on the gate wiring lines 122 and 126, and the storage wiring lines 128a, 128b, 129a, and 129b, as well as on exposed surfaces of the insulating substrate 10.

A semiconductor layer 140 formed of hydrogenated a-Si or polysilicon is formed on the gate insulating layer 30. The semiconductor layer 140 may have various shapes, such as an island shape or a stripe shape. For example, as shown in FIG. 11A, the semiconductor layer 140 may be formed to have an island shape, and formed to overlap an area occupied by the gate electrode 126.

Ohmic contact layers 155 and 156 formed of silicide or n+ hydrogenated a-Si in which n-type impurities are doped at high concentration are formed on the semiconductor layer 140.

Data lines 162, a source electrode 165, and first and second drain electrodes 166a and 166b are formed on the ohmic contact layers 155 and 156, and the gate insulating layer 30.

Data lines 162 extend in a second direction, for example, a vertical direction, cross the gate lines 122 and the storage lines 128a and 128b, and transmit data voltages. The source electrode 165 extends from each of the data lines 162 and extends toward the first and second drain electrodes 166a and 166b. As shown in FIG. 11A, the data voltage applied to the source electrode 165 from the data line 162 is transmitted to each of the first and second sub-pixel electrodes 182a and 182b through each of the first and second drain electrodes 166a and 166b.

The data lines 162, the source electrode 165, and the first and second drain electrodes 166a and 166b are referred to as data wiring lines. The data wiring lines 162, 165, 166a, and 166b may be formed of substantially the same materials as the data wiring lines 62a, 62b, 65a, 65b, 66a, and 66b previously described with respect to FIG. 3A.

The semiconductor layer 140 is partially overlapped by the source electrode 165 that is branched off from the data lines 162 in a branch shape. The semiconductor layer 140 is at least partially overlapped by the first and second drain electrodes 166a and 166b that face the source electrode 165 with respect to the gate electrode 126. Here, the above-described ohmic contact layers 155 and 156 may exist between the semiconductor layer 140 and the source electrode 165 and between the semiconductor layer 140 and the first and second drain electrodes 166a and 166b to reduce contact resistance.

Each of the first and second drain electrodes 166a and 166b includes a bar-shaped pattern, which overlaps the semiconductor layer 140 adjacent to the source electrode 165, and a drain electrode extension portion that extends from the bar-shaped pattern and has a large area overlapping the storage electrodes 129a and 129b. First and second contact holes 176a and 176b are located on each drain electrode extension portion. The drain electrode extension portions, and the pixel electrode 182 or the first and second storage electrodes 129a and 129b overlap each other so as to form storage capacitors.

A passivation layer 70 is formed on the data wiring lines 162, 165, 166a, and 166b and the exposed semiconductor layer 140, as well as on exposed portions of the gate insulating layer 30. The first and second contact holes 176a and 176b are formed through the passivation layer 70 to expose the large area portions of the drain electrode extension portions of the first and second drain electrodes 166a and 166b.

The pixel electrode 182 formed on the passivation layer 70 includes first and second sub-pixel electrodes 182a and 182b that are separated from each other by a gap 183. Here, each of the first and second sub-pixel electrodes 182a and 182b may be formed of a transparent electric conductor, such as ITO or IZO, or a reflective electric conductor, such as aluminum.

The first and second sub-pixel electrodes 182a and 182b are electrically connected to the first and second drain electrodes 166a and 166b through the first and second contact holes 176a and 176b, respectively, and are applied with data voltages from the first and second drain electrodes 166a and 166b.

The first and second sub-pixel electrodes 182a and 182b, to which the data voltages are applied, generate an electric field together with the common electrode on the upper display panel, thereby determining the arrangement of liquid crystal molecules between the first and second sub-pixel electrodes 182a and 182b and the common electrode.

Further, referring to FIGS. 10 and 11A, the sub-pixel electrodes 182a and 182b and the common electrode form the liquid crystal capacitors Clca and Clcb and maintain the applied voltages even after TFTs Q1 and Q2 are turned off. In order to increase the voltage maintaining capacity, the storage capacitors Csta and Cstb connected in parallel with the liquid crystal capacitors Clca and Clcb may be formed in such a manner that the storage wiring lines 128a and 128b are overlapped by the first and second sub-pixel electrodes 182a and 182b or the first and second drain electrodes 166a and 166b connected to the first and second sub-pixel electrodes 182a and 182b.

The first and second storage voltages having different values from each other may be applied to the first and second storage lines 128a and 128b, respectively. For example, the first and second storage voltages may be common voltages Vcom that have opposite phases to each other.

Since the first and second sub-pixel electrodes 182a and 182b are coupled to the first and second storage lines 128a and 128b, respectively, the data voltage applied to the first sub-pixel electrode 182a and the data voltage applied to the second sub-pixel electrode 182b are coupled to the first and second storage voltages, respectively, and thus the values thereof are changed.

For example, the first and second storage voltages may be voltages having opposite phases to each other. Therefore, the first and second sub-pixel electrodes 182a and 182b have a predetermined voltage deviation. For example, the data voltage formed in the first sub-pixel electrode 182a may be a larger value than the data voltage formed in the second sub-pixel electrode 182b, even though they receive data voltages from the same data line 162. In an exemplary embodiment, the first sub-pixel electrode 182a may operate at a low gray scale level, and the second sub-pixel electrode 182b may operate at an intermediate gray scale level or higher.

Returning to FIGS. 11A to 11C, one pixel electrode 182 includes the first and second sub-pixel electrodes 182a and 182b that are separated by a predetermined gap 183 to be electrically separated from each other.

It is preferable that the first sub-pixel electrode 182a be formed in a pixel region so as not to overlap the data lines 162. For example, the first sub-pixel electrode 182a may have a rectangular shape as illustrated, but the present invention is not limited thereto.

The second sub-pixel electrode 182b is formed in a region of a pixel that excludes the first sub-pixel electrode 182a. Specifically, the second sub-pixel electrode 182b surrounds an outer edge or outer periphery of the first sub-pixel electrode 182a, that is, the top/bottom/left/right of the first sub-pixel electrode 182a. Preferably, at least a part of the second sub-pixel electrode 182b overlaps the data line 162. The second sub-pixel electrode 182b may overlap the data lines 162 by a predetermined width d2, and the overlap width d2 may be in a range of approximately 2 to 3 μm. The second sub-pixel electrode 182b may overlap the data line 162 from which the second sub-pixel electrode 182b receives data voltages, and the second sub-pixel electrode 182b may also overlap an adjacent data line 162. Here, the second sub-pixel electrode 182b overlaps the data lines 162 to thereby increase an aperture ratio of the LCD.

The gap 183 that separates the first and second sub-pixel electrodes 182a and 182b from each other may be formed by a width d1 of, for example, about 5 to about 6 μm.

Initially, the same data voltages are applied to the first and second sub-pixel electrodes 182a and 182b via the data line 162. However, due to coupling between the first and second storage lines 128a and 128b and the first and second sub-pixel electrodes 182a and 182b, a relatively higher data voltage is formed in the first sub-pixel electrode 182a and a relatively lower data voltage is formed in the second sub-pixel electrode 182b. Accordingly, side visibility of the LCD can be improved.

Further, the first sub-pixel electrode 182a does not overlap the data line 162, but the second sub-pixel electrode 182b is disposed between the first sub-pixel electrode 182a and data line 162 to prevent coupling there between. Therefore, it is possible to effectively prevent vertical crosstalk.

In particular, when the LCD operates at a low gray scale level, since liquid crystal substantially operates by the first sub-pixel electrode 182a, to which the relatively lower voltage is applied, it is possible to effectively prevent vertical crosstalk by preventing the coupling between the first sub-pixel electrode 182a and the data line 162.

An alignment layer (not shown) that aligns a liquid crystal layer may be applied to the first and second sub-pixels 182a and 182b and the passivation layer 70.

Figure 12A:
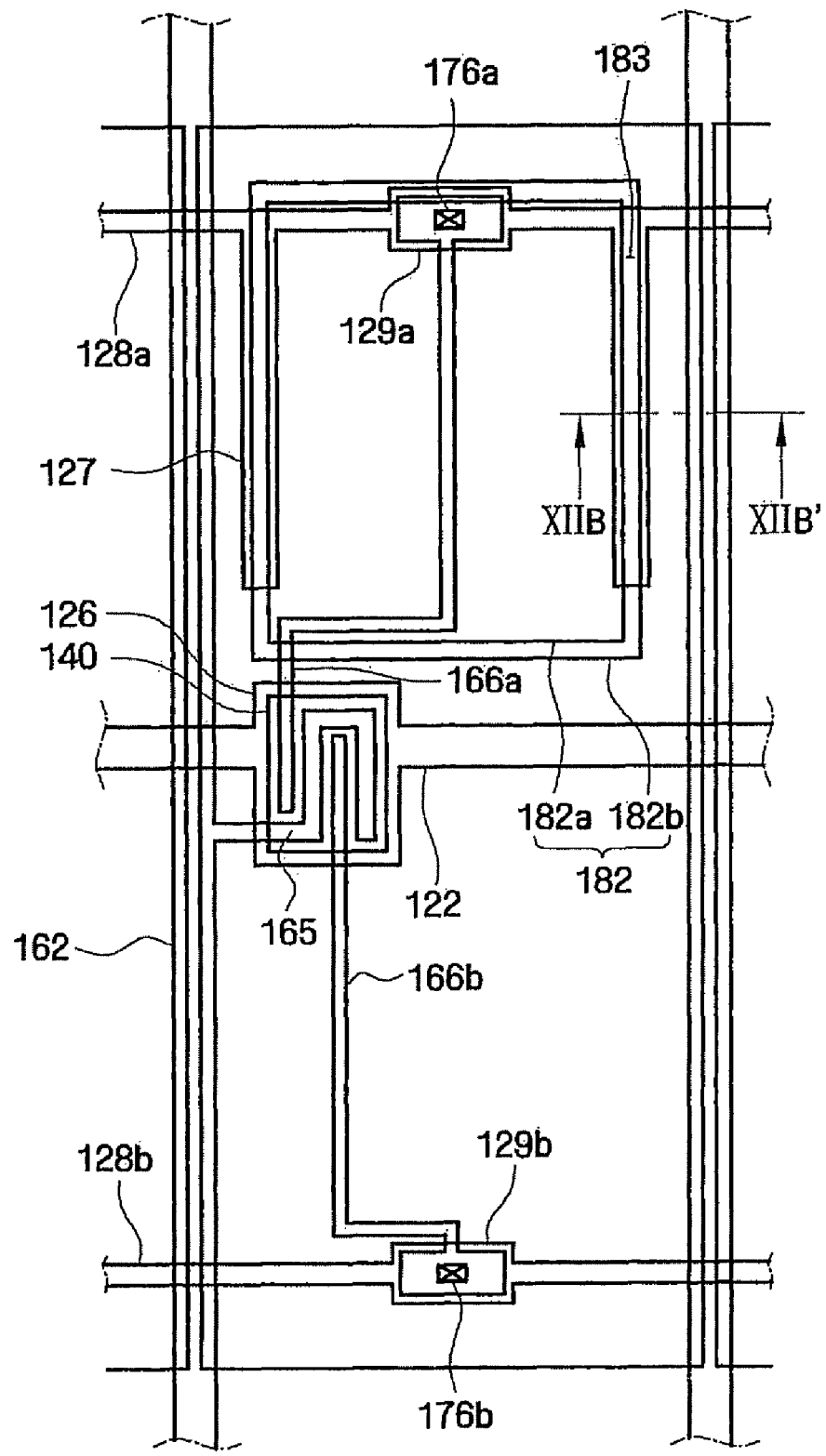
FIG. 12A is a layout view of an exemplary lower display panel of an exemplary LCD according to a fourth exemplary embodiment of the present invention.
Figure 12B:
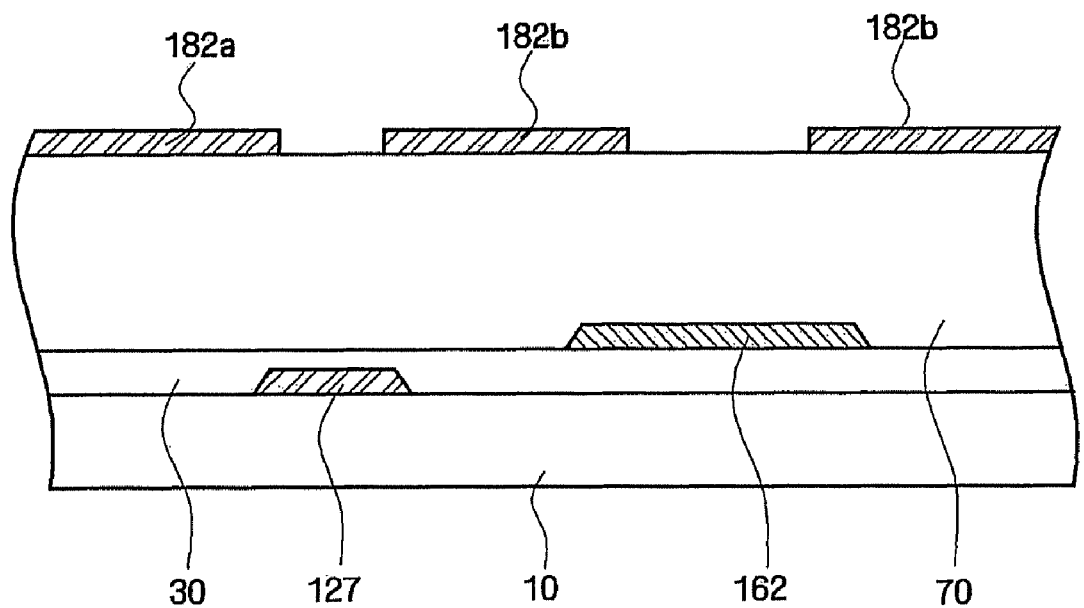
FIG. 12B is a cross-sectional view of the exemplary lower display panel taken along line XIIB-XIIB' of FIG. 12A.

Hereinafter, an exemplary lower display panel of an exemplary LCD according to a fourth exemplary embodiment of the present invention will be described with reference to FIGS. 12A and 12B. Here, FIG. 12A is a layout view of the exemplary lower display panel of the exemplary LCD according to the fourth exemplary embodiment of the present invention. FIG. 12B is a cross-sectional view of the exemplary lower display panel taken along line XIIB-XIIB' of FIG. 12A. For convenience of explanation, parts having the same functions as those in the above-described embodiment illustrated in FIGS. 10 to 11C are represented by the same reference numerals, and thus the descriptions thereof will be omitted. A description will be made concerning the differences.

First storage wiring lines 127, 128a, and 129a that are coupled to a first sub-pixel electrode 182a include a first storage line 128a that extends in the substantially same direction as the gate line 122, a first storage electrode 129a that protrudes from the first storage line 128a, has a large width, and forms a storage capacitor by overlapping with the first drain electrode 166a, and an additional storage electrode 127 that is branched off from the first storage line 128a and is extended along gaps 183. In the illustrated embodiment, a first portion of the additional storage electrode 127 extends along a portion of the gap 183 adjacent to the data line 162 from which the pixel electrode 182 receives data voltages, and a second portion of the additional storage electrode 127 extends along a portion of the gap 183 adjacent to a data line 162 of an adjacent pixel in the row direction.

The first sub-pixel electrode 182a and the second sub-pixel electrode 182b may be separated from each other by a width of the gap 183, for example, by a width of approximately 5 to 6 μm. To prevent light leakage from occurring through the gap 183, the additional storage electrode 127, which is branched off from the first storage line 128a, and the gap 183 overlap each other, such that the vicinity of the gap 183 is blocked to thereby prevent light leakage.

The additional storage electrode 127 may be branched off from the first storage line 128a and substantially extend in parallel with the data line 162.

Hereinafter, referring to FIGS. 13 to 16, an exemplary LCD according to a fifth exemplary embodiment of the present invention will be described with reference to FIGS. 13 to 16.

Figure 13:
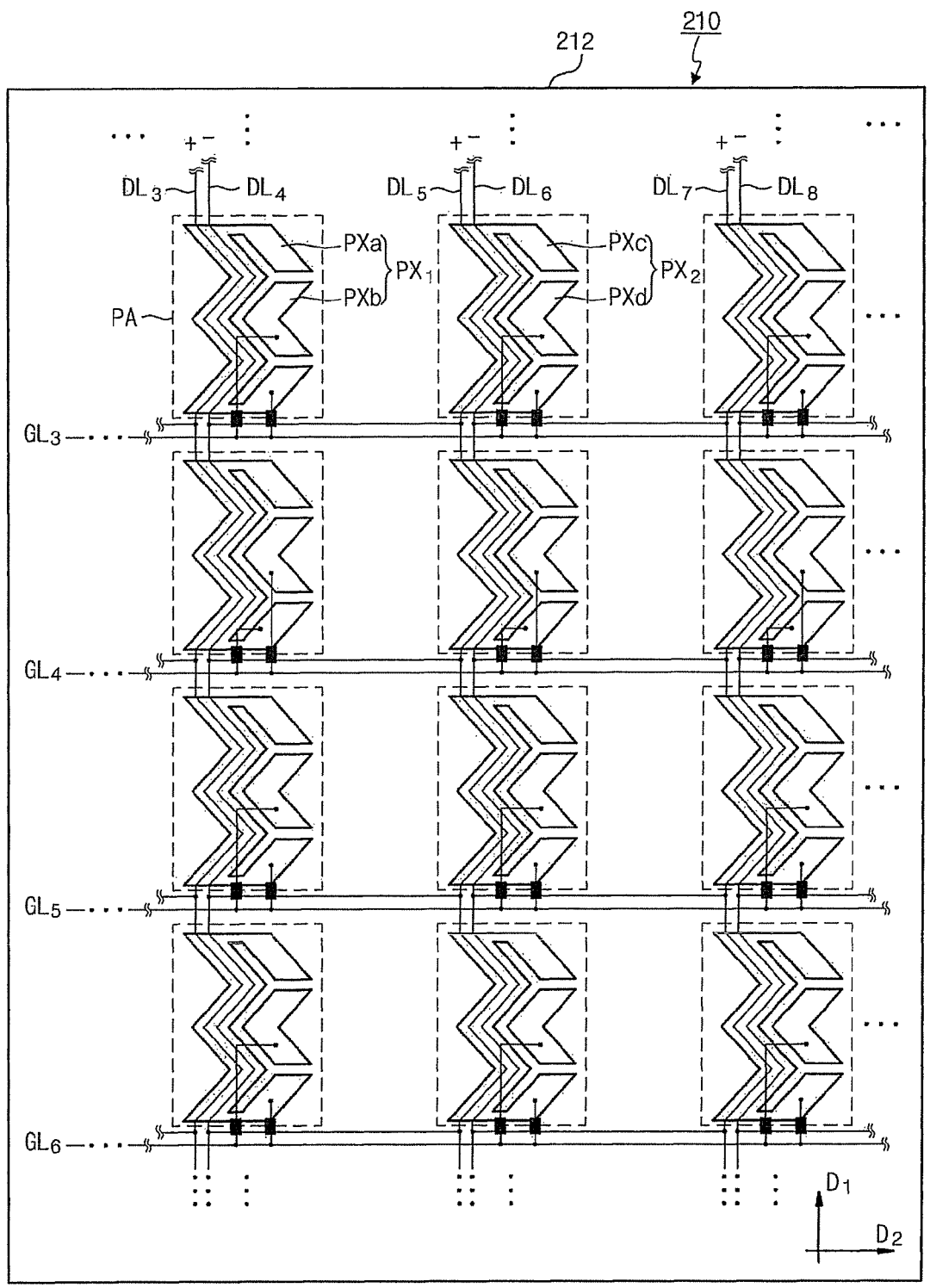
FIG. 13 is a diagram illustrating a part of an exemplary lower display panel of an exemplary LCD according to a fifth exemplary embodiment of the present invention.

FIG. 13 is a diagram illustrating a part of an exemplary lower display panel of an exemplary LCD according to a fifth exemplary embodiment of the present invention.

Referring to FIG. 13, a lower display panel 210 includes a base substrate 212, a plurality of gate lines GL1 to GLn, where GL3 to GL6 are illustrated for exemplary purposes, and a plurality of data line pairs DL1/DL2, DL3/DL4, DL5/DL6 to DLm−1/DLm, where DL3/DL4 to DL7/DL8 are illustrated for exemplary purposes, and a plurality of pixels PX. The lower display panel 210 according to the fifth exemplary embodiment of the present invention further includes a first switching element T1 and a second switching element T2, as more clearly shown in FIG. 14, that provide two data voltages having different polarities to each of the pixels.

The base substrate 212 is a transparent insulating substrate and includes a plurality of pixel regions PA that are arranged in a matrix format. The plurality of gate lines GL1 to GLn and the plurality of data line pairs DL1/DL2, DL3/DL4, DL5/DL6 to DLm−1/DLm are formed and wired on the base substrate 212. The plurality of gate lines GL1 to GLn extend in a second direction D2. The plurality of data line pairs DL1/DL2, DL3/DL4, DL5/DL6 to DLm−1/DLm extend substantially in a first direction D2, such that the plurality of data line pairs are insulated from the plurality of gate lines GL2 to GLn and cross them.

Here, the data line pairs DL1/DL2, DL3/DL4, DL5/DL6 to DLm−1/DLm are formed by grouping every two adjacent data lines, and one pixel region PA overlaps each of the data line pairs. Each of the data line pairs has a zigzag shape, in which the shape of the data line pairs is repeated in the second direction D2 to have an "M" shape within each pixel region PA.

The plurality of the pixel electrodes PX, such as PX1 and PX2, are formed on the plurality of pixel regions PA, respectively, which are arranged in a matrix shape. Each of the pixel electrodes PX includes a first sub-pixel electrode, such as PXa of pixel electrode PX1 and PXc of pixel electrode PX2, and a second sub-pixel electrode, such as PXb of pixel electrode PX1 and PXd of pixel electrode PX2, that are sequentially formed in the second direction D2. Further, in addition to the pixel electrode PX, a first TFT T1 and a second TFT T2 are further formed on the pixel region PA.

Figure 14:
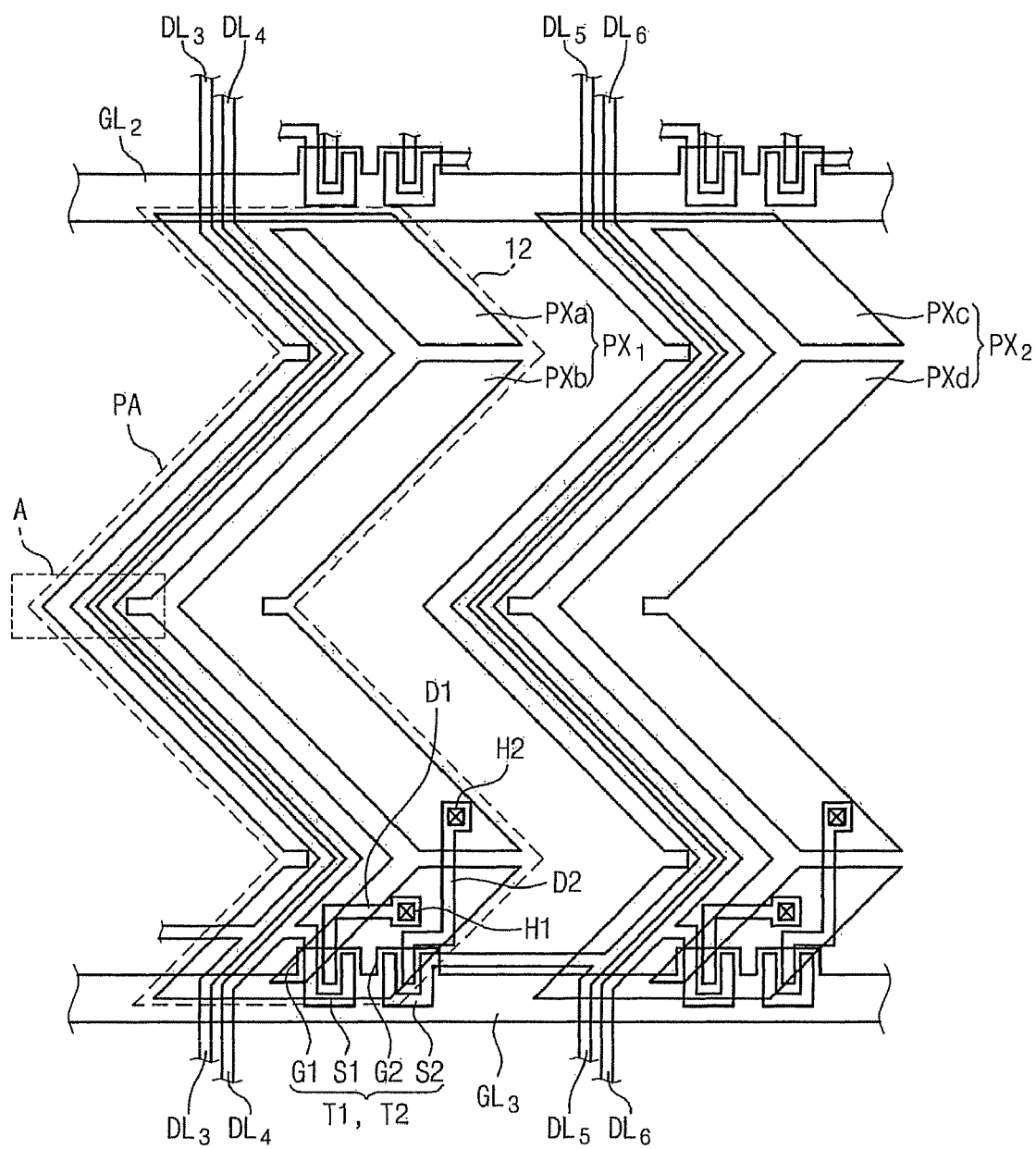
FIG. 14 is a layout view illustrating a structure of one exemplary pixel electrode PX shown in FIG. 13 in detail.

FIG. 14 is a layout view illustrating a structure of one exemplary pixel electrode PX1 shown in FIG. 13 in further detail.

Referring to FIG. 14, the pixel electrode PX1 includes a first sub-pixel electrode PXa and a second sub-pixel electrode PXb. The pixel electrode PX1 has a center that is curved in a left direction in parallel with a gate line GL3, and is symmetrical about the curved center. Then, both ends of the pixel electrode PX1 are curved in a right direction that is opposite to the direction in which the center of the pixel electrode PX1 is curved.

The data line DL4 that corresponds to the pixel electrode PX1 and the other data line DL3 in the data line pair DL3/DL4 are adjacent to each other and are formed substantially in the first direction D1. Therefore, the pixel electrode PX1 overlaps the data line pair DL3/DL4. The data lines DL3 and DL4 may be applied with different data voltages from each other and the data line DL4 applies data voltages to the pixel electrode PX1.

The first TFT T1 is formed by the gate line GL3 and the data line DL4, and the first sub-pixel electrode PXa is electrically connected to the first TFT T1. The first TFT T1 includes a first gate electrode G1 that is branched off from the gate line GL3, a first source electrode S1 that is branched off from the data line DL4, and a first drain electrode D1 that is separated from the first source electrode S1 and electrically connected to the first sub-pixel electrode PXa through a first contact hole H1.

The second TFT T2 is formed by the gate line GL3 and the data line DL5, and the second sub-pixel electrode PXb is electrically connected to the second TFT T2. Here, it should be noted that the data line DL5 is formed to correspond to, that is, to be overlapped by, an adjacent pixel electrode PX2.

The second TFT T2 includes a second gate electrode G2 that is branched off from the gate line GL3, a second source electrode S2 that is branched off from the data line DL5, which is wired to correspond to the adjacent pixel electrode PX2, and a second drain electrode D2 that is separated from the second source electrode S2 and electrically connected to the second sub-pixel electrode PXb through a second contact hole H2.

Different data voltages are applied to the first sub-pixel electrode PXa and the second sub-pixel electrode PXb through the first and second TFTs T1 and T2.

The first and second sub-pixel electrodes PXa and PXb of the pixel electrode PX1 belong to the same pixel region PA. The different data voltages that correspond to the same image information and complement each other are applied to the sub-pixel electrodes PXa and PXb so as to display high quality images. For example, a swing width of a voltage level (on the basis of the common voltage Vcom) of the data voltage that is applied to the first sub-pixel electrode PXa may be larger or smaller than that of a voltage level (on the basis of the common voltage Vcom) of the data voltage that is applied to the second sub-pixel electrode PXb. Further, the data voltage applied to the first sub-pixel electrode PXa and the data voltage applied to the second sub-pixel electrode PXb may have phase differences opposite to each other. FIG. 14 shows an example in which an area of the first sub-pixel electrode PXa is designed to be larger than an area of the second sub-pixel electrode PXb.

When the area of the second sub-pixel electrode PXb, to which a relatively higher data voltage is applied, is smaller than that of the first sub-pixel electrode PXa, it is possible to make a side gamma curve closer to a front gamma curve. In particular, when an area ratio of the first sub-pixel electrode PXa to the second sub-pixel electrode PXb is about 2:1 to about 3:1, the side gamma curve is made closer to the front gamma curve, thereby improving side visibility.

Therefore, different optical characteristics occur in a region where the first and second sub-pixel electrodes PXa and PXb are formed, and the optical characteristics are compensated by each other, such that display quality can be further improved.

Meanwhile, as shown in FIG. 14, the pixel electrode PX1 including the first sub-pixel electrode PXa and the second sub-pixel electrode PXb is formed to have an "M" shape within pixel region PA that is symmetrical in a longitudinal direction of the gate line GL3. Further, the adjacent data lines DL3 and DL4 have a shape corresponding to the pixel electrode PX1, and the first sub-pixel electrode PXa overlaps the data lines DL3 and DL4. Preferably, the first sub-pixel electrode PXa completely overlaps the adjacent data lines DL3 and DL4 of the data line pair DL3/DL4.

In general, unit pixel regions are defined by gate lines and data lines. At this time, the data lines overlap an edge of the pixel region or are formed on the edge of the pixel region. In this case, it is difficult to maintain a predetermined interval between the pixel region and the data lines during a process of forming a pattern.

Therefore, in the lower display panel according to exemplary embodiments of the present invention, the pixel electrode completely overlaps the data lines, such that a coupling error due to irregular intervals between the data line pairs and the pixel electrode can be eliminated.

FIG. 15 is a block diagram illustrating an exemplary LCD to which an exemplary lower display panel shown in FIG. 13 is applied. For simplification, data line pairs connected to each of the pixel electrodes PX are shown as straight lines. However, as shown in FIGS. 13 and 14, each of the data line pairs may be wired in a zigzag shape, and each of the pixel electrodes PX overlap the data line pairs.

An LCD 300 shown in FIG. 15 includes a liquid crystal panel 310, a timing controller 320, a gray voltage generator 330, a data driver 340, and a gate driver 350. While the liquid crystal panel 310 is utilized in the LCD 300 shown in FIG. 15, the remaining elements of the LCD 300 may be adapted for use with liquid crystal panels containing lower display panels of any of the previously described embodiments.

The liquid crystal panel 310 may include the lower display panel 210 of FIG. 13 and an upper display panel (not shown) facing the lower display panel 210.

The timing controller 320 controls image data signals R, G, and B according to a timing that is required by the data driver 340 and the gate driver 350, and outputs the controlled image data signals R, G, and B. Further, the timing controller 320 outputs first and second control signals CNTL1 and CNTL2 that control the data driver 340 and the gate driver 350. Examples of the first control signal CNTL1 may include a horizontal synchronization start signal STH, a data output signal TP, and the like. Examples of the second control signal CNTL2 may include a scan start signal STV, a gate clock signal CPV, an output enable signal OE, and the like.

The gray voltage generator 330 generates a plurality of gray voltages related to transmittance of the pixel electrode PX, and supplies the generated gray voltages to the data driver 340 as described below.

The data driver 340 drives data line pairs DL1/DL2, DL3/DL4 to DLm−1/DLm of the liquid crystal panel 310 in response to the first control signal CNTL1 that is applied from the timing controller 320, and the gray voltages that are applied from the gray voltage generator 330.

The data driver 340 receives the first control signal CNTL1 and image signals DAT with respect to one pixel row from the timing controller 320, and selects a gray voltage corresponding to each of the image signals DAT among the gray voltages generated by the gray voltage generator 330. Then, after the data driver 340 converts the selected gray voltage into a corresponding data voltage, the data driver 340 applies the data voltage to corresponding data line pairs DL1/DL2, DL3/DL4 to DLm−1/DLm. As described above, data voltages that have phase differences opposite to each other and voltages of different levels are applied to the data line pairs.

The gate driver 350 drives gate lines GL1 to GLn of the liquid crystal panel 310 in response to the second control signal CNTL2 input from the timing controller 320 and a gate on voltage VON and a gate off voltage VOFF that are output from a driving voltage generator (not shown). The gate driver 350 applies gate voltages to the pixel electrodes PX through the gate lines GL1 to GLn, respectively, and "turns on or off" the first and second TFTs (T1 and T2 of FIG. 14) that are connected to each of the pixel electrodes PX.

Figure 16:
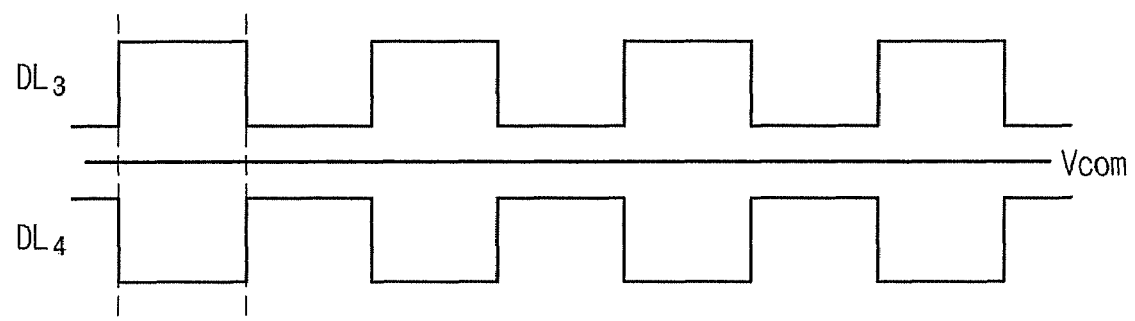
FIG. 16 is a waveform chart of a data voltage that is applied to each exemplary pixel electrode in order to implement an image pattern including a white pattern and a gray pattern.

FIG. 16 is a waveform chart of a data voltage that is applied to each of the exemplary pixel electrodes in order to implement an image pattern including a white pattern and a gray pattern.

Referring to FIG. 16, a voltage waveform of the data line DL3 is a waveform of a voltage that is applied to the first sub-pixel electrode (PXa of FIG. 13) from the data driver 340, and a voltage waveform of the data line DL4 is a waveform of a voltage that is applied to the second sub-pixel electrode (PXb of FIG. 13) from the data driver 340.

As shown in FIGS. 13 and 16, it is preferable that the voltage waveforms of the data lines DL3 and DL4 have phases opposite to each other and swing in order to allow adjacent data line pairs DL3/DL4 to offset a coupling effect on the pixel electrode PX1. Therefore, it is possible to completely eliminate coupling that occurs between each pixel electrode PX and the data line pairs DL1/DL2, DL3/DL4 to DLm−1/DLm.

As a result, each of the pixel electrodes (specifically, first sub-pixel electrodes) completely overlaps the respective data line pairs DL1/DL2, DL3/DL4 to DLm−1/DLm, thereby eliminating coupling errors between the data line pairs and the pixel electrodes PX. Further, the data line pairs are applied with data voltages, respectively, which swing in a direction where the data voltages offset each other. Therefore, coupling between the data line pairs and the pixel electrode is eliminated.

As described above, according to the LCD of the exemplary embodiments of the present invention, it is possible to prevent light leakage around the data lines and to increase an aperture ratio. Further, the coupling capacitances between the sub-pixel electrode and the first and second data lines are reduced to thereby prevent deterioration in display characteristics of the LCD. Therefore, it is possible to prevent vertical crosstalk that may occur at a low gray scale level.

Further, the gap between the first and second sub-pixel electrodes may be blocked by the storage electrode to thereby prevent light leakage.

Further, it is possible to increase visibility of the LCD and achieve a high aperture ratio.

Although the present invention has been described in connection with the exemplary embodiments of the present invention, it will be apparent to those skilled in the art that various modifications and changes may be made thereto without departing from the scope and spirit of the invention. Therefore, it should be understood that the above exemplary embodiments are not limitative, but illustrative in all aspects.

What is claimed is:

1. A liquid crystal display comprising:
   a first insulating substrate;
   gate lines formed on the first insulating substrate and extending in a first direction;
   data lines insulated from and crossing the gate lines, and the data lines extending in a second direction; and
   pixel electrodes, each of which includes first and second sub-pixel electrodes,
   wherein at least a part of each second sub-pixel electrode overlaps the data lines,
   wherein the first sub-pixel electrode of each of the pixel electrodes does not overlap the data lines, and
   wherein the first sub-pixel electrode and the second sub-pixel electrode are electrically separated.

2. The liquid crystal display of claim 1, wherein, for each pixel electrode, a data voltage applied to the first sub-pixel electrode is higher than a data voltage applied to the second sub-pixel electrode.

3. The liquid crystal display of claim 1, wherein, for each pixel electrode, the second sub-pixel electrode completely overlaps respective data lines in a widthwise direction of the data lines.

4. The liquid crystal display of claim 1, wherein, for each pixel electrode, the first sub-pixel electrode includes a V-shape, and the second sub-pixel electrode is formed in a region of a pixel that excludes the first sub-pixel electrode.

5. The liquid crystal display of claim 1, wherein, for each pixel electrode, the second sub-pixel electrode is formed to surround the first sub-pixel electrode.

6. The liquid crystal display of claim 5, wherein, for each pixel electrode:
   the second sub-pixel electrode comprises main regions that are substantially inclined toward the data lines by about 45° or about −45°, and bridge regions that are arranged along and overlap the data lines, and the bridge regions connect to the main regions.

7. The liquid crystal display of claim 1, wherein the data lines comprise first and second data lines that supply different data voltages to the first and second sub-pixel electrodes, respectively, for each pixel electrode.

8. The liquid crystal display of claim 7, wherein first-type pixels, each of which has a first sub-pixel electrode to which a data voltage is applied from a first data line, and second-type pixels, each of which has a first sub-pixel electrode to which a data voltage is applied from a second data line, are alternately arranged in the first and second directions.

9. The liquid crystal display of claim 1, further comprising:
   storage lines and storage electrode formed over the first insulating substrate and substantially extending in parallel with the gate lines; and
   additional storage electrodes connected to the storage lines and substantially extending in parallel with the data lines.

10. The liquid crystal display of claim 9, wherein a gap that separates the first and second sub-pixel electrodes from each other in each pixel electrode partially overlaps the additional storage electrodes.

11. The liquid crystal display of claim 10, wherein, for each pixel electrode, the first sub-pixel electrode overlaps at least a part of the additional storage electrodes.

12. The liquid crystal display of claim 11, wherein a width by which the additional storage electrodes and the first sub-pixel electrode overlap each other is in a range of about 1 to about 3 μm.

13. The liquid crystal display of claim 1, further comprising:
   a second insulating substrate facing the first insulating substrate;
   a common electrode formed on the second insulating substrate; and
   a liquid crystal layer interposed between the first and second insulating substrates, and the liquid crystal layer including liquid crystal molecules.

14. The liquid crystal display of claim 1, further comprising a passivation layer formed of an organic material, and interposed between the data lines and the pixel electrodes.

15. A liquid crystal display comprising:
   gate lines and data lines insulated from and crossing each other on an insulating substrate;
   pixel electrodes, each of which includes first and second sub-pixel electrodes;
   a first storage line overlapping the first sub-pixel electrode and receiving a first storage voltage; and
   a second storage line overlapping the second sub-pixel electrode and receiving a second storage voltage different from the first storage voltage,
   wherein at least a part of each second sub-pixel electrode overlaps the data lines,
   wherein the first sub-pixel electrode of each of the pixel electrodes does not overlap the data lines,
   wherein the first sub-pixel electrode and the second sub-pixel electrode are electrically separated.

16. The liquid crystal display of claim 15, wherein the second storage voltage has an opposite phase to the first storage voltage.

17. The liquid crystal display of claim 15, wherein same data voltages applied to the first and second sub-pixel electrodes from the data lines become different from each other due to coupling between the same data voltages and the first and second storage voltages.

18. The liquid crystal display of claim 15, wherein the second sub-pixel electrode overlaps the data lines by a width of about 2 to about 3 μm.

19. The liquid crystal display of claim 15, further comprising:
   a storage electrode branched off from the first storage line and overlapping the gap.

20. The liquid crystal display of claim 19, wherein the storage electrode substantially extends in parallel with the data lines.

21. The liquid crystal display of claim 15, further comprising a passivation layer formed of an organic material, and interposed between the data lines and the first and second sub-pixel electrodes.

22. A liquid crystal display comprising:
gate lines;
data line pairs insulated from and crossing the gate lines; and
pixel electrodes electrically connected to the gate lines and the data line pairs, respectively,
wherein each of the pixel electrodes includes a first sub-pixel electrode and a second sub-pixel electrode having a smaller area than the first sub-pixel electrode,
wherein at least a part of each second sub-pixel electrode overlaps the data lines, and
wherein the first sub-pixel electrode of each of the pixel electrodes does not overlap the data lines, and
wherein the first sub-pixel electrode and the second sub-pixel electrode are electrically separated.

23. The liquid crystal display of claim 22, wherein:
each of the pixel electrodes has a curved center that is curved in a first direction in parallel with the gate line and is symmetrical about the curved center, and
both ends of each pixel electrode are curved in a second direction opposite to the first direction based on the curved center.

24. The liquid crystal display of claim 23, wherein each of the data line pairs has a shape corresponding to a shape of each pixel electrode and is overlapped by the first sub-pixel electrode of each pixel electrode.

25. The liquid crystal display of claim 23, wherein each of the data line pairs is formed in a zigzag shape and is overlapped by the first sub-pixel electrode of each pixel electrode.

26. The liquid crystal display of claim 22, further comprising:
first and second thin film transistors supplying two data voltages from the data line pairs to the first and second sub-pixel electrodes, respectively.

27. The liquid crystal display of claim 26, wherein the two data voltages have phases opposite to each other.

28. The liquid crystal display of claim 26, wherein the two data voltages have different voltage levels.

29. The liquid crystal display of claim 22, further comprising a passivation layer formed of an organic material, and interposed between the data line pairs and the pixel electrodes.

30. A method of improving display quality of a liquid crystal display, the liquid crystal display having a matrix of pixel regions, the method comprising:
forming gate lines on an insulating substrate, the gate lines extending substantially in a first direction;
forming data lines insulated from the gate lines, the data lines extending substantially in a second direction, the second direction substantially perpendicular to the first direction;
forming first and second sub-pixel electrodes within each pixel region such that the second sub-pixel electrodes overlap adjacent data lines and the first sub-pixel electrode does not overlap the adjacent data lines in each pixel region, the second sub-pixel electrodes at least partially surrounding the first sub-pixel electrodes and having a larger area than the first sub-pixel electrodes; and,
applying a data voltage to the first sub-pixel electrodes that is larger than a data voltage applied to the second sub-pixel electrodes, and
wherein the first sub-pixel electrode and the second sub-pixel electrode are electrically separated.

31. The liquid crystal display of claim 1, further comprising a common electrode which faces the pixel electrode and is applied with a common voltage,
wherein, for each pixel, a potential difference between the common voltage and a data voltage applied to the first sub-pixel electrode is greater than a potential difference between the common voltage and a data voltage applied to the second sub-pixel electrode.

32. The liquid crystal display of claim 15, further comprising a common electrode which faces the pixel electrode and is applied a common voltage,
wherein, for each pixel electrode, a potential difference between the common voltage and a data voltage applied to the first sub-pixel electrode is greater than a potential difference between the common voltage and a data voltage applied to the second sub-pixel electrode.

33. The liquid crystal display of claim 22, further comprising a common electrode which faces the pixel electrode and is applied with a common voltage,
wherein, for each pixel electrode, a potential difference between the common voltage and a data voltage applied to the first sub-pixel electrode is greater than a potential difference between the common voltage and a data voltage applied to the second sub-pixel electrode.

* * * * *